United States Patent
Jinnai et al.

(10) Patent No.: US 12,096,685 B2
(45) Date of Patent: Sep. 17, 2024

(54) PERSISTENT LUMINESCENCE EMITTER

(71) Applicant: Okinawa Institute of Science and Technology School Corporation, Okinawa (JP)

(72) Inventors: Kazuya Jinnai, Fukuoka (JP); Ryota Kabe, Kunigami-gun Okinawa (JP); Chihaya Adachi, Itoshima (JP)

(73) Assignee: OKINAWA INSTITUTE OF SCIENCE AND TECHNOLOGY SCHOOL CORPORATION, Okinawa (JP)

( * ) Notice: Subject to any disclaimer, the term of this patent is extended or adjusted under 35 U.S.C. 154(b) by 411 days.

(21) Appl. No.: 17/590,251

(22) Filed: Feb. 1, 2022

(65) Prior Publication Data
US 2022/0246861 A1    Aug. 4, 2022

(30) Foreign Application Priority Data
Feb. 1, 2021    (JP) .................................. 2021-014296

(51) Int. Cl.
| H10K 85/60 | (2023.01) |
| H10K 50/11 | (2023.01) |
| H10K 50/16 | (2023.01) |
| H10K 50/18 | (2023.01) |
| H10K 101/10 | (2023.01) |
| H10K 101/30 | (2023.01) |
| H10K 101/40 | (2023.01) |

(52) U.S. Cl.
CPC ......... H10K 85/6572 (2023.02); H10K 50/11 (2023.02); H10K 50/16 (2023.02); H10K 50/18 (2023.02); H10K 2101/10 (2023.02); H10K 2101/30 (2023.02); H10K 2101/40 (2023.02)

(58) Field of Classification Search
CPC ...................................................... H10K 50/11
See application file for complete search history.

(56) References Cited

U.S. PATENT DOCUMENTS

2018/0346807 A1 * 12/2018 Kabe ..................... C09K 11/06
2020/0165516 A1    5/2020 Kabe et al.

OTHER PUBLICATIONS

De Leeuw, et al., Stability of n-type doped conducting polymers and consequences for polymeric microelectronic devices, Synthetic Metals, 87:53-59 (1997).
Jinnai, et al., Wide-Range Tuning and Enhancement of Organic Long-Persistent Luminescence Using Emitter Dopants, Advance Materials, 30:1-6 (2018).
Jinnai, et al., Fabrication-method Independence of Organic Long-persistent Luminescence Performance, Chem. Lett., 48:270-273 (2019).
Kabe, et al., Organic long persistent luminescence, Nature, 550:384-395 (Oct. 2017).

(Continued)

*Primary Examiner* — Yu-Hsi D Sun
(74) *Attorney, Agent, or Firm* — Browdy and Neimark, PLLC

(57) ABSTRACT

Disclosed is a persistent luminescence emitter containing an electron donor molecule and an electron acceptor molecule having a LUMO level of lower than −3.5 eV, wherein emission intensity increases by temperature rise after photo-irradiation of the persistent luminescence emitter stops.

17 Claims, 12 Drawing Sheets

(56) References Cited

OTHER PUBLICATIONS

Lin, et al., Organic Long-Persistent Luminescence from a Flexible and Transparent Doped Polymer, Advanced Materials, 30:1-5 (2018).
Nishimura, et al., Many Exciplex Systems Exhibit Organic Long-Persistent Luminescence, Advanced Functional Materials, 30:1-6 (2020).
Notsuka, et al., Confinement of Long-Lived Triplet Excitons in Organic Semiconducting Host-Guest Systems, Advanced Functional Materials, 27:1-6 (2017).
Romero, et al., Organic Photoredox Catalysis, Chemical Reviews, 116:10075-10166 (2016).
Zhou, et al., High performance n-type and ambipolar small organic semiconductors for organic thin film transistors, Phys. Chem. Chem. Phys., 16:22448-22457 (2014).

* cited by examiner

PERSISTENT LUMINESCENCE EMITTER

CROSS-REFERENCE TO RELATED APPLICATION

This application claims the benefit of priority from Japanese Application No. 2021-014296, filed Feb. 1, 2021, the disclosure of which application is incorporated by reference herein in its entirety.

FIELD OF THE INVENTION

The present invention relates to a persistent luminescence emitter containing organic compounds. The present invention also relates to use of a molecule having a LUMO level of lower than −3.5 eV as an acceptor molecule in a persistent luminescence emitter.

BACKGROUND ART

Research on photoluminescence has been actively conducted[1-44]. Long persistent luminescence (LPL) is a phenomenon in which luminescence persists for a long time after photoexcitation[1]. Currently, LPL emitters are used as glow-in-the-dark paints for clock faces and emergency lights. Present high-efficiency LPL materials are composed of microcrystals of metal oxides and small amounts of rare-earth ions that act as charge trapping sites and emission sites[2,3]. In these inorganic LPL materials, holes or electrons generated by the photoexcitation of the metal oxide crystals are accumulated in the dopants that act as charge trap sites. The gradual charge recombination followed by thermal detrapping produces long-lived emission more than hours[4-6]. However, the inorganic LPL materials are insoluble in any solvent which requires extra processes for applications. Moreover, most inorganic LPL systems require ultraviolet (UV) to blue excitation light below 450 nm due to the limited absorption band of the metal oxides[7,8].

To solve the problems of such inorganic LPL materials, we have recently reported the LPL emission from mixtures of organic molecules[9]. This organic LPL (OLPL) system can be fabricated from a solution process[10] and the fabricated films can be transparent and flexible[11]. Moreover, the LPL emission colour can be tuned from greenish blue to red by the addition of fluorescent materials[12]. In contrast to the conventional organic room temperature phosphorescent (RTP) materials[13], which store their energy into triplet excited states and exhibit radiative transition from the triplet excited states to the singlet ground states[14], the OLPL systems accumulate their energy into charge-separated states similar to inorganic LPL materials. Here, LPL and RTP can be identified from their emission decay profiles[15].

However, present OLPL systems require inert gas condition to exhibit LPL because LPL is completely quenched in air. The OLPL system made by an electron donation material and an electron-accepting material stores absorbed energy into the geminate pairs of the air-unstable radical cations of donor and the radical anions of acceptors. For practical applications of OLPL systems, the air-stability needs to be improved.

NON-PATENT LITERATURE

1. Xu, J. & Tanabe, S. Persistent luminescence instead of phosphorescence: History, mechanism, and perspective. *J. Lumin.* 205, 581-620 (2019).
2. Li, Y., Gecevicius, M. & Qiu, J. Long persistent phosphors—from fundamentals to applications. *Chem. Soc. Rev.* 45, 2090-2136 (2016).
3. Ueda, J., Miyano, S. & Tanabe, S. Formation of Deep Electron Traps by $Yb^{3+}$ Codoping Leads to Super-Long Persistent Luminescence in $Ce^{3+}$ Doped Yttrium Aluminum Gallium Garnet Phosphors. *ACS Appl. Mater. Interfaces* 10, 20652-20660 (2018).
4. Majewska, N. et al. Study of persistent luminescence and thermoluminescence in $SrSi_2N_2O_2:Eu^{2+},M^{3+}$ (M=Ce, Dy, and Nd). *Phys. Chem. Chem. Phys.* 22, 17152-17159 (2020).
5. Vitola, V., Millers, D., Bite, I., Smits, K. & Spustaka, A. Recent progress in understanding the persistent luminescence in $SrAl_2O_4:Eu,Dy$. *Mater. Sci. Technol.* 35, 1661-1677 (2019).
6. Dorenbos, P. Mechanism of persistent luminescence in $Sr_2MgSi_2O_7:Eu^{2+};Dy^{3+}$. *Phys. status solidi* 242, R7-R9 (2005).
7. Li, Y. et al. Long persistent and photo-stimulated luminescence in $Cr^{3+}$-doped Zn—Ga—Sn—O phosphors for deep and reproducible tissue imaging. *J. Mater. Chem. C* 2, 2657 (2014).
8. Zhuang, Y., Ueda, J., Tanabe, S. & Dorenbos, P. Band-gap variation and a self-redox effect induced by compositional deviation in $ZnxGa_2O_{3+x}:Cr^{3+}$ persistent phosphors. *J. Mater. Chem. C* 2, 5502 (2014).
9. Kabe, R. & Adachi, C. Organic long persistent luminescence. *Nature* 550, 384-387 (2017).
10. Jinnai, K., Nishimura, N., Kabe, R. & Adachi, C. Fabrication-method Independence of Organic Long-persistent Luminescence Performance. *Chem. Lett.* 48, 270-273 (2019).
11. Lin, Z., Kabe, R., Nishimura, N., Jinnai, K. & Adachi, C. Organic Long-Persistent Luminescence from a Flexible and Transparent Doped Polymer. *Adv. Mater.* 30, 1803713 (2018).
12. Jinnai, K., Kabe, R. & Adachi, C. Wide-Range Tuning and Enhancement of Organic Long-Persistent Luminescence Using Emitter Dopants. *Adv. Mater.* 30, (2018).
13. Hirata, S. Recent Advances in Materials with Room-Temperature Phosphorescence: Photophysics for Triplet Exciton Stabilization. *Adv. Opt. Mater.* 5,1700116 (2017).
14. Notsuka, N., Kabe, R., Goushi, K. & Adachi, C. Confinement of Long-Lived Triplet Excitons in Organic Semiconducting Host-Guest Systems. *Adv. Funct. Mater.* 27, 1703902 (2017).
15. Nishimura, N., Lin, Z., Jinnai, K., Kabe, R. & Adachi, C. Many Exciplex Systems Exhibit Organic Long—Persistent Luminescence. *Adv. Funct. Mater.* 30, 2000795 (2020).
16. Usta, H. et al. Design, synthesis, and characterization of ladder-type molecules and polymers. air-stable, solution-processable n-channel and ambipolar semiconductors for thin-film transistors via experiment and theory. *J. Am. Chem. Soc.* 131, 5586-5608 (2009).
17. de Leeuw, D. M., Simenon, M. M. J., Brown, A. R. & Einerhand, R. E. F. Stability of n-type doped conducting polymers and consequences for polymeric microelectronic devices. *Synth. Met.* 87, 53-59 (1997).
18. Zhou, K., Dong, H., Zhang, H. & Hu, W. High performance n-type and ambipolar small organic semiconductors for organic thin film transistors. *Phys. Chem. Chem. Phys.* 16, 22448-22457 (2014).
19. Romero, N. A. & Nicewicz, D. A. Organic Photoredox Catalysis. *Chem. Rev.* 116, 10075-10166 (2016).

20. Fukuzumi, S. et al. Electron-transfer state of 9-mesityl-10-methylacridinium ion with a much longer lifetime and higher energy than that of the natural photosynthetic reaction center. *J. Am. Chem. Soc.* 126, 1600-1601 (2004).
21. Todd, W. P., Dinnocenzo, J. P., Farid, S., Goodman, J. L. & Gould, I. R. Efficient photoinduced generation of radical cations in solvents of medium and low polarity. *J. Am. Chem. Soc.* 113, 3601-3602 (1991).
22. Alam, P. et al. Two are better than one: a design principle for ultralong persistent luminescence of pure organics. 6, 1-11.
23. Jia, D. Charging curves and excitation spectrum of long persistent phosphor $SrAl_2O_4:Eu^{2+}$, $Dy^{3+}$. *Opt. Mater. (Amst).* 22, 65-69 (2003).
24. Jia, D., Zhu, J. & Wu, B. Correction of excitation spectra of long persistent phosphors. *J. Lumin.* 90, 33-37 (2000).
25. Wintgens, V., Pouliquen, J., Kossanyi, J., Williams, J. L. R. & Doty, J. C. Emission of substituted pyrylium and thiapyrylium salts: Phosphorescence and delayed fluorescence emission in polymeric matrices. *Polym. Photochem.* 6, 1-20 (1985).
26. Farid, S., Dinnocenzo, J. P., Merkel, P. B., Young, R. H. & Shukla, D. Bimolecular Electron Transfers That Follow a Sandros-Boltzmann Dependence on Free Energy. *J. Am. Chem. Soc.* 133, 4791-4801 (2011).
27. Perkowski, A. J., You, W. & Nicewicz, D. A. Visible Light Photoinitiated Metal-Free Living Cationic Polymerization of 4-Methoxystyrene. *J. Am. Chem. Soc.* 137, 7580-7583 (2015).
28. Schrögel, P. et al. Meta-linked CBP-derivatives as host materials for a blue iridium carbene complex. *Org. Electron.* 12, 2047-2055 (2011).
29. Jiang, Z.-L., Tian, W., Kou, Z.-Q., Cheng, S. & Li, Y.-H. The influence of the mixed host emitting layer based on the TCTA and TPBi in blue phosphorescent OLED. *Opt. Commun.* 372, 49-52 (2016).
30. Kuwabara, Y., Ogawa, H., Inada, H., Noma, N. & Shirota, Y. Thermally stable multilared organic electroluminescent devices using novel starburst molecules, 4,4',4''-Tri(N-carbazolyl)triphenylamine (TCTA) and 4,4',4''-Tris(3-methylphenylphenylamino)triphenylamine (m-MTDATA), as hole-transport materials. *Adv. Mater.* 6, 677-679 (1994).
31. Goushi, K., Yoshida, K., Sato, K. & Adachi, C. Organic light-emitting diodes employing efficient reverse intersystem crossing for triplet-to-singlet state conversion. *Nat. Photonics* 6, 253-258 (2012).
32. Hamill, W. H. Debye-Edwards electron recombination kinetics. *J. Chem. Phys.* 71, 140-142 (1979).
33. Tachiya, M. & Seki, K. Unified explanation of the fluorescence decay and blinking characteristics of semiconductor nanocrystals. *Appl. Phys. Lett.* 94, 081104 (2009).
34. Lin, Z., Kabe, R., Wang, K. & Adachi, C. Influence of energy gap between charge-transfer and locally excited states on organic long persistence luminescence. *Nat. Commun.* 11, 191 (2020).
35. Niizuma, S. et al. Free Radicals Produced from the Derivatives of Pyrylium Salts in Solution by Photoillumination. *Bull. Chem. Soc. Jpn.* 68, 2600-2607 (1985).
36. Miranda, M. A. & Garcia, H. 2,4,6-Triphenylpyrylium Tetrafluoroborate as an Electron-Transfer Photosensitizer. *Chem. Rev.* 94, 1063-1089 (1994).
37. Lochner, C. M., Khan, Y., Pierre, A. & Arias, A. C. All-organic optoelectronic sensor for pulse oximetry. *Nat. Commun.* 5, 5745 (2014).
38. Sakurai, M. et al. Organic Photostimulated Luminescence Organic photostimulated luminescence. 1-32 (2020) doi:org/10.26434/chemrxiv.12956456.v1.
39. Ueda, J., Hashimoto, A. & Tanabe, S. Orange Persistent Luminescence and Photodarkening Related to Paramagnetic Defects of Nondoped $CaO-Ga_2O_3-GeO_2$ Glass. *J. Phys. Chem. C* 123, 29946-29953 (2019).
40. Ueda, J., Harada, M., Miyano, S., Yamada, A. & Tanabe, S. Pressure-induced variation of persistent luminescence characteristics in $Y_3Al_{5-x}Ga_xO_{12}:Ce^{3+}-M^{3+}$ (M=Yb, and Cr) phosphors: opposite trend of trap depth for 4f and 3d metal ions. *Phys. Chem. Chem. Phys.* 22, 19502-19511 (2020).
41. Hasebe, N. et al. Absolute Phosphorescence Quantum Yields of Singlet Molecular Oxygen in Solution Determined Using an Integrating Sphere Instrument. *Anal. Chem.* 87, 2360-2366 (2015).
42. Baldo, M. A., O'Brien, D. F., Thompson, M. E. & Forrest, S. R. Excitonic singlet-triplet ratio in a semiconducting organic thin film. Phys. Rev. B 60, 14422-14428 (1999).
43. Fan, C. et al. Dibenzothiophene-Based Phosphine Oxide Host and Electron-Transporting Materials for Efficient Blue Thermally Activated Delayed Fluorescence Diodes through Compatibility Optimization. Chem. Mater. 27, 5131-5140 (2015).
44. Liu, Y., Liu, M. S. & Jen, A. K.-Y. Synthesis and characterization of a novel and highly efficient light-emitting polymer. *Acta Polym.* 50, 105-108 (1999).

SUMMARY OF INVENTION

In view of the problems of the conventional LPL systems, the present inventors have pursued diligent research with the aim of developing a new stable OLPL system, particularly an OLPL system with improved air stability. As a result of assiduous investigations, the present inventors succeeded in developing an air-stable OLPL system with an electron acceptor molecule having a low LUMO level.

The present application includes the following inventions.
[1] A long persistent luminescence emitter emitting light for 0.1 seconds or longer after photo-irradiation of the long persistent luminescence emitter stops, wherein:
  the long persistent luminescence emitter comprises an electron donor molecule and an electron acceptor molecule having a LUMO level of lower than −3.5 eV, and
  emission intensity increases by temperature rise after photo-irradiation of the persistent luminescence emitter stops.
[2] The long persistent luminescence emitter according to [1], wherein an electron transfer occurs from the electron donor molecule to the electron acceptor molecule by photo-irradiation of the long persistent luminescence emitter.
[3] The long persistent luminescence emitter according to [1] or [2], wherein after photo-irradiation of the long persistent luminescence emitter stops, emission intensity decays non-exponentially.
[4] The long persistent luminescence emitter according to any one of [1] to [3], wherein after photo-irradiation of the persistent luminescence emitter stops, the emission intensity decay follows a power law.
[5] The long persistent luminescence emitter according to any one of [1] to [4], wherein the electron acceptor molecule has a LUMO level of −3.8 eV or lower.

[6] The long persistent luminescence emitter according to any one of [1] to [5], wherein the electron acceptor molecule has a HOMO level of −6.0 eV or lower.

[7] The long persistent luminescence emitter according to any one of [1] to [6], wherein the electron acceptor molecule is cationic.

[8] The long persistent luminescence emitter according to [7], wherein the electron acceptor molecule is an organic photoredox catalyst.

[9] The long persistent luminescence emitter according to [8], wherein the electron acceptor molecule is represented by one of the following formulae (1) to (4):

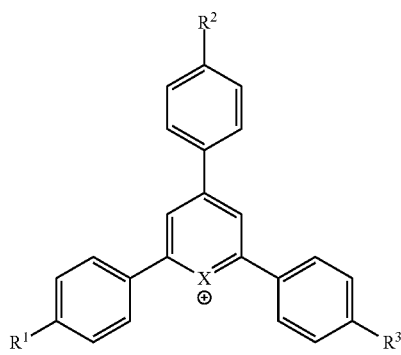

Formula (1)

wherein X represents O or S; and $R^1$ to $R^3$ each independently represent a hydrogen atom or a substituent;

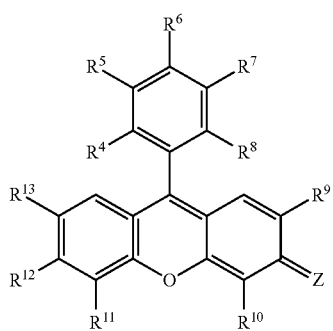

Formula (2)

wherein Z represents O or $NR^{31}R^{32}$; $R^8$ represents $COOR^{33}$; $R^4$ to $R^7$, $R^9$ to $R^{13}$ and $R^{31}$ to $R^{33}$ each independently represent a hydrogen atom or a substituent;

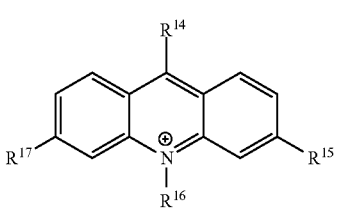

Formula (3)

wherein $R^{14}$ to $R^{17}$ each independently represent a hydrogen atom or a substituent;

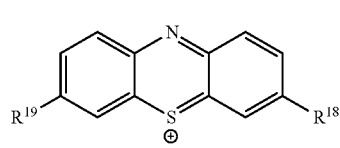

Formula (4)

wherein $R^{18}$ and $R^{19}$ each independently represent a hydrogen atom or a substituent.

[10] The long persistent luminescence emitter according to [9], wherein the electron acceptor molecule is represented by the formula (1).

[11] The long persistent luminescence emitter according to any one of [1] to [10], which comprises the electron acceptor molecule in an amount of at most 10 mol % or at least 90 mol % based on the total amount by mole of the electron donor molecule and the electron acceptor molecule.

[12] The long persistent luminescence emitter according to any one of [1] to [11], wherein a charge-transfer excited state formed between the electron donor molecule and the electron acceptor molecule exhibits the long persistent luminescence.

[13] The long persistent luminescence emitter according to any one of [1] to [12], which further comprises a luminescent material.

[14] The long persistent luminescence emitter according to any one of [1] to [13], which further comprises a hole trap material.

[15] The long persistent luminescence emitter according to any one of [1] to [14], which further comprises an electron trap material.

[16] Use of a molecule having a LUMO level of lower than −3.5 eV as an acceptor molecule in a long persistent luminescence emitter emitting light for 0.1 seconds or longer after photo-irradiation of the long persistent luminescence emitter stops.

[17] Use according to [16], wherein the molecule is an organic photoredox catalyst.

[18] A thermoluminescent material comprising an organic electron donor molecule and an organic electron acceptor molecule having a LUMO level of lower than −3.5 eV, wherein after photo-irradiation of the material stops, emission intensity decays non-exponentially.

[19] The thermoluminescent material according to [18], wherein an electron transfer occurs from the organic electron donor molecule to the organic electron acceptor molecule by photo-irradiation of the material.

[20] Use of a composition as a thermoluminescent material, wherein the composition comprises an organic electron donor molecule and an organic electron acceptor molecule having a LUMO level of lower than −3.5 eV, and after photo-irradiation of the material stops, emission intensity decays non-exponentially.

BRIEF DESCRIPTION OF THE DRAWINGS

FIG. 6. Cyclic voltammograms of the molecules in dried and oxygen-free DMF containing 0.1 M TBAPF$_6$.

DETAILED DESCRIPTION OF INVENTION

Figure 1:
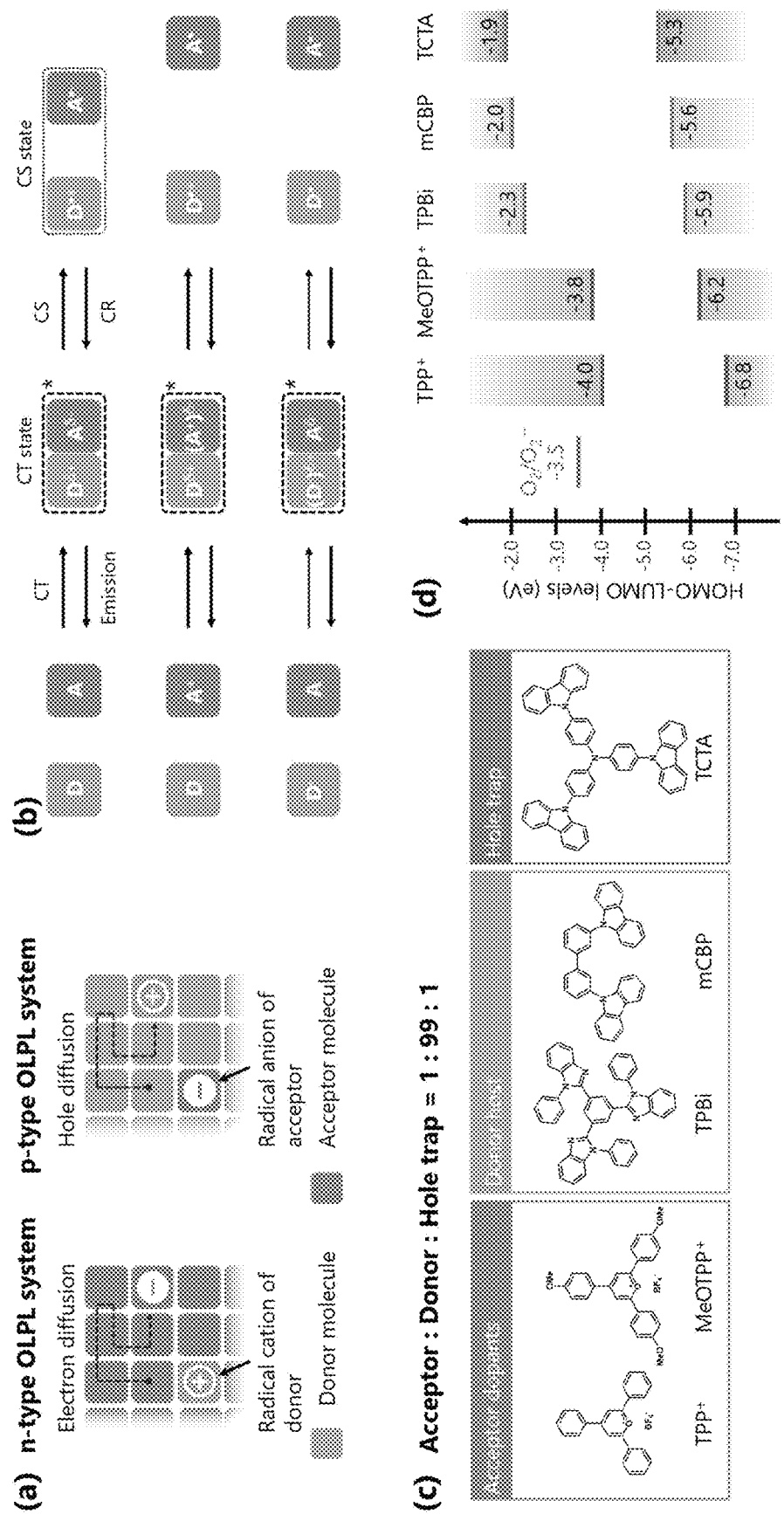
FIG. 1. Emission mechanism of p-type OLPL system. (a) Schematic diagram of the charge separated states of n-type and p-type OLPL systems. Radical anions of acceptor diffuse in n-type OLPL system and radical cations of donor diffuse in p-type system. (b) Charge separated states of the neutral molecules and ionized molecules. Cationic acceptor and anionic donor can form neutral radicals. (c) Chemical structures of the electron acceptors, donors, and hole trap molecule. (d) HOMO and LUMO levels of the materials and the reduction potential of oxygen.

The invention is explained in detail below. Although the explanations of the features described below are sometimes given based on typical embodiments or specific examples of the invention, the invention is not limited to the embodiments or the specific examples. A range indicated using "to" in this description means a range which includes the values before and after "to" as the lower limit and the upper limit, respectively.

The "room temperature" in this description means 20° C. In this description, "photoexcitation" is conducted with a light to excite a targeted substance to provide light emission, and for this, a light whose wavelength correspond to the absorption wavelength of the targeted substance can be used.

(Features of Long Persistent Luminescence Emitter)

The long persistent luminescence emitter of the invention contains an electron donor molecule and an electron acceptor molecule. Luminescence is observed at 10 K after photo-irradiation of the long persistent luminescence emitter stops.

The emission intensity of the long persistent luminescence emitter increases by temperature rise after photo-irradiation of the persistent luminescence emitter stops. The persistent luminescence emitter shows stronger luminescence than before the temperature increase (thermoluminescence). The thermoluminescence can be observed by the process described in the examples below. In the invention, the recombination process of the molecules is accelerated by thermal energy provided to raise the temperature. Unlike the invention, the emission intensity of phosphorescence emitter and delayed-fluorescence emitter does not increase by temperature rise after photo-irradiation of the emitters stops. The mechanism of the long persistent luminescence of the invention can be distinguished from those of phosphorescence and delayed-fluorescence. The "electron donor molecule" in the invention means a molecule which releases an electron upon photo-irradiation of the long persistent luminescence emitter and is converted to an oxidized state such as a neutral radical state and a radical cation state (a neutral radical state is preferable in the invention). The "electron acceptor molecule" in the invention means a molecule which receives the electron released from the electron donor molecule and is converted to a reduced state such as a radical anion state and a neutral radical state. The presence of a radical can be confirmed by ESR (Electron Spin Resonance) measurement, absorption measurement or the like.

The "exciplex luminescence" or "luminescence from a charge-transfer excited state" in the invention means luminescence from an excited state (exciplex) which is generated when an electron donor molecule associates with an electron acceptor molecule. The luminescence spectrum pattern of the exciplex luminescence is different from those of the luminescence observed from the electron donor molecule alone and of the luminescence observed from the electron acceptor molecule alone. The "exciplex luminescence" or "luminescence from a charge-transfer excited state" shows a luminescence spectrum pattern different from those of the luminescence observed from the electron donor molecule alone and of the luminescence observed from the electron acceptor molecule alone upon photo-irradiation. Here, the luminescence spectrum pattern of the long persistent luminescence emitter of the invention has a different luminescence spectrum shape from those of the luminescence spectrum observed from the electron donor molecules alone and of the luminescence spectrum observed from the electron acceptor molecules alone. This means: the wavelength of the maximum luminescence may be different; the half width or the rising slope of a luminescence peak may be different; or the number of luminescence peaks may be different.

Luminescence is observed from the long persistent luminescence emitter of the invention at 10 K (preferably also at 20° C.). The oxidized state of the electron donor molecules and the reduced state of the electron acceptor molecules are stable. It is presumed that, due to these features, electron donor molecules in the oxidized state and electron acceptor molecules in the reduced state accumulate in the long persistent luminescence emitter during photo-irradiation and that the luminescence continues by the recombination of the molecules even after the photo-irradiation stops. Accordingly, the long persistent luminescence emitter can continue to exhibit luminescence for a long time.

Here, in this description, the luminescence after photo-irradiation stops is sometimes called "persistent luminescence", and the length of time from the point at which the photo-irradiation stops to the point at which the emission intensity can no longer be detected is sometimes called "persistent luminescence duration time". The long persistent luminescence emitter in the present application means along persistent luminescence emitter having persistent luminescence duration time of 0.1 seconds or longer. The persistent luminescence duration time of the long persistent luminescence emitter of the invention is preferably 1 second or longer, more preferably 5 seconds or longer, further preferably 5 minutes or longer, still further preferably 20 minutes or longer. The long persistent luminescence emitter of the invention preferably achieves not only such long persistent luminescence duration time at 10 K but also such long persistent luminescence duration time at 20° C.

The emission intensity can be measured using, for example, a spectrometer. The emission intensity of luminescence of less than 0.01 cd/m² can be considered as undetectable. In the working examples shown below, the detection limit is 1/1000 of the initial emission intensity.

A presumed luminescence mechanism of the long persistent luminescence emitter is explained below. Although specific structural formulae of the electron donor molecules and the electron acceptor molecules are shown in FIG. 1, they are examples and the electron donor molecules and the electron acceptor molecules which can be used in the invention should not be construed as being limited by these specific examples.

When light that is capable of exciting an electron acceptor molecule is applied to the long persistent luminescence emitter, the electron acceptor molecule absorbs the light, and an electron is transferred from the HOMO (Highest Occupied Molecular Orbital) to the LUMO (Lowest Unoccupied Molecular Orbital). An electron moves from the HOMO of an electron donor molecule to the HOMO of the electron acceptor molecule. This means that a hole moves from the HOMO of the electron acceptor molecule to the HOMO of an electron donor molecule. In this manner, a charge-separated state is generated by an electron donor molecule in the oxidized state and an electron acceptor molecule in the reduced state.

Such a charge-separated state can be generated by another mechanism. When light that is capable of exciting a donor molecule is applied to the long persistent luminescence emitter, the electron donor molecule absorbs the light, and an electron is transferred from the HOMO to the LUMO. An electron moves from the LUMO of an electron donor molecule to the LUMO of the electron acceptor molecule, and an hole is generated in the HOMO of the electron donor molecule. In this manner, a charge-separated state is generated by an electron donor molecule in the oxidized state and an electron acceptor molecule in the reduced state.

The hole generated in the HOMO of the electron donor molecule moves to the HOMO of adjacent electron donor molecules, from one to another, and is diffused when a sufficient amount of electron donor molecules are contained in the long persistent luminescence emitter. The diffused hole may be trapped by a hole trap material when it is contained in the long persistent luminescence emitter. The trapped hole can be detrapped by heat or photostimulation and diffused in the electron donor molecules again. When the diffused hole reaches the interface between the electron donor molecule area and the electron acceptor molecule area, the hole recombines with an electron of an electron acceptor molecule at the interface, and energy is generated by the recombination.

The electron generated in the LUMO of the electron acceptor molecule moves to the LUMO of adjacent electron acceptor molecules, from one to another, and is diffused when a sufficient amount of electron acceptor molecules are contained in the long persistent luminescence emitter. The diffused electron may be trapped by an electron trap material when it is contained in the long persistent luminescence emitter. The trapped electron can be detrapped by heat or photostimulation and diffused in the electron acceptor molecules again. When the diffused electron reaches the interface between the electron donor molecule area and the electron acceptor molecule area, the electron recombines with a hole of an electron donor molecule at the interface, and energy is generated by the recombination.

Using the recombination energy, for example, the electron donor molecule associates with the electron acceptor molecule to form an exciplex (charge-transfer excited state). Fluorescence is emitted when the excited singlet state $S_1$ returns to the ground state, while phosphorescence is emitted when the excited triplet state $T_1$ returns to the ground state. Alternatively, reverse intersystem crossing occurs from the excited triplet state $T_1$ to the excited singlet state $S_1$, and fluorescence is emitted when the excited singlet state $S_1$ returns to the ground state. The fluorescence emitted through reverse intersystem crossing is fluorescence observed later than the fluorescence from an excited singlet state $S_1$ which has been directly transferred from the ground state and is called "delayed fluorescence" in this description.

Here, because the electron donor molecule and the electron acceptor molecule are spatially apart in the exciplex formed by the electron donor molecule and the electron acceptor molecule, the difference $\Delta E_{ST}$ between the lowest excited singlet energy level and the lowest excited triplet energy level can be made very small compared to the case where an electron donor and an electron acceptor are present in one molecule. As a result, the reverse intersystem crossing occurs with a high probability, and the energy of the excited triplet state $^3CT$ can also be used effectively for fluorescence emission. Thus, high luminescence efficiency can be obtained. Moreover, in the invention, it is presumed that electron donor molecules in the oxidized state and electron acceptor molecules in the reduced state accumulate efficiently during photo-irradiation because the oxidized state of the electron donor molecule and the reduced state of the electron acceptor molecule are stable. Therefore, even after the photo-irradiation stops, the luminescence mechanism and the following processes work, and the long persistent luminescence emitter can continue to exhibit luminescence for a long time.

The long persistent luminescence by the above luminescence mechanism can be confirmed when a log-log graph showing the change in the emission intensity with time after applying light to the long persistent luminescence emitter, for example, for three minutes and stopping the photo-irradiation (the emission intensity on a logarithmic scale of the y-axis and the time on a logarithmic scale of the x-axis) is non-exponential. In some preferable embodiments of the invention, the emission intensity decay follows a power law. Here, light having a wavelength absorbed by the electron acceptor molecule or the electron donor molecule can be used as the excitation light applied to the long persistent luminescence emitter.

It has been confirmed that, in the case of general phosphorescence due to photoluminescence of an organic compound, the emission intensity decays exponentially. A semi-log graph of the emission intensity on a logarithmic scale of the y-axis and the time of the x-axis (time on a linear scale, but not on a logarithmic scale) shows exponential decay (first-order decay). On the other hand, the semi-log graph of the luminescence from the long persistent luminescence emitter of the invention shows non-exponential decay, and the luminescence mechanism is clearly different from that of general phosphorescence.

Whether the electron transition from the HOMO to the LUMO due to light absorption occurs in the electron acceptor molecules or in the electron donor molecules depends on the ratio of the electron donor molecules to the electron acceptor molecules and on the absorption wavelengths of the molecules. That is, when the proportion of the electron donor molecules is relatively high or when the absorption wavelength of the electron donor molecules is closer to the wavelength of the applied light than the absorption wavelength of the electron acceptor molecules, charge-separated states are more likely to be generated through the electron movement from the LUMO of the electron donor molecules to the LUMO of the electron acceptor molecules.

As described above, the long persistent luminescence emitter of the invention exhibits persistent luminescence using electron donor molecules that are stable in the oxidized state and electron acceptor molecules with a LUMO level of lower than −3.5 eV that are very stable in the reduced state and can be achieved using organic compounds as the electron donor and acceptor molecules without the use of any inorganic salts containing rare-earth elements. Therefore, the long persistent luminescence emitter can be produced using inexpensive organic compounds as raw materials by simple steps, and the excitation wavelength, the emission wavelength and the emission duration time can be regulated easily by molecular design of the electron acceptor molecules and the electron donor molecules. Moreover, the transparency of organic compounds is easily realized. Organic compounds dissolve in many organic solvents, and a homogeneous paint containing organic compounds can be obtained.

Thus, a uniform long persistent luminescent film composed of the long persistent luminescence emitter with an excellent pattern can be formed.

The electron donor and acceptor molecules contained in the long persistent luminescence emitter and other components which are added according to the need are explained below.

(Electron Acceptor Molecule)

The electron acceptor molecule constituting the long persistent luminescence emitter of the invention has a LUMO level of lower than −3.5 eV. The electron acceptor molecule is stable in a reduced state and can exhibit persistent luminescence at 10 K when it is combined with an electron donor molecule. For example, a molecule which forms an exciplex with an electron donor molecule at 10 K (and preferably also at 20° C.) and emits light can be selected. The gap between the HOMO level and the LUMO level of the electron acceptor molecule is preferably 1.0 to 3.5 eV, more preferably 1.5 to 3.4 eV, further preferably 2.0 to 3.3 eV. With the gap, an electron can be transferred from the HOMO to the LUMO efficiently upon photo-irradiation of the long persistent luminescence emitter. The LUMO level of the electron acceptor molecule is preferably lower than −3.7 eV, for example from −3.7 eV to −4.5 eV. The HOMO level of the electron acceptor molecule is preferably lower than −5.0 eV, more preferably lower than −5.5 eV, still more preferably lower than −6.0 eV, for example from −6.0 eV to −7.5 eV.

The HOMO and LUMO levels of the electron acceptor molecule can be measured by photoemission spectroscopy, cyclic voltammetry, and absorption spectroscopy.

Preferable electron acceptor molecules are cationic electron acceptors, particularly organic photoredox catalysts[19]. The organic photoredox catalysts are ideal electron acceptors because of their high oxidation potential in the excited state and their ability to form a stable one-electron reduced state. Also, many organic photoredox catalysts have an enough energy gap to exhibit luminescence in the visible region. Furthermore, a mixture of neutral donors and neutral acceptors forms radical ion pairs ($D^{\delta+}$-$A^{\delta-}$) having Coulomb interaction by the photo-induced charge separation, whereas cationic acceptors or anionic donors form neutral radicals rather than radical anions or radical cations ($D^{\delta+}$-$(A^+)^{\delta-}$, $(D^-)^{\delta+}$-$A^{\delta-}$) (FIG. 1b). The formation of neutral radicals is expected to reduce the Coulomb interaction in the charge separated state[20-22].

Preferable compounds which can be used as the electron acceptor molecule are shown below. In this regard, however, the electron acceptor molecules which can be used in the invention should not be construed as being limited by these specific examples.

Examples of preferable electron acceptor molecules include pyrylium compounds. Typical pyrylium compounds are represented by the following formula (1).

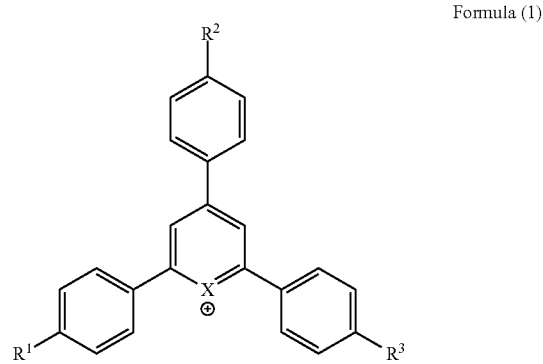

Formula (1)

In the formula (1), X represents O or S; and $R^1$ to $R^3$ each independently represent a hydrogen atom or a substituent. Preferable substituents for $R^1$ to $R^3$ are an alkyl group and an alkoxy group. The following compounds are included in the formula (1).

Compound 1: X is O; and $R^1$ to $R^3$ are H

Compound 2: X is O; and $R^1$ to $R^3$ are $OCH_3$

Compound 3: X is S; and $R^1$ to $R^3$ are H

Compound 4: X is S; and $R^1$ to $R^3$ are $OCH_3$

Examples of preferable electron acceptor molecules include xanthene compounds. Typical xanthene compounds are represented by the following formula (2).

Formula (2)

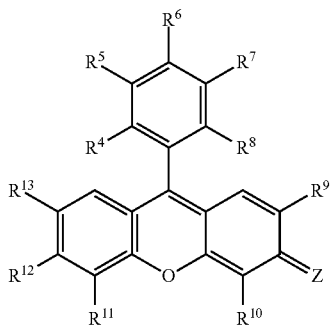

In the formula (2), Z represents O or $NR^{31}R^{32}$; $R^8$ represents $COOR^{33}$; $R^4$ to $R^7$, $R^9$ to $R^{13}$ and $R^{31}$ to $R^{33}$ each independently represent a hydrogen atom or a substituent. $R^{31}$ to $R^{33}$ are preferably a hydrogen atom or an alkyl group. Preferable substituents for $R^4$ to $R^7$, $R^9$ to $R^{13}$ are an alkyl group, a halogen atom, a hydroxy group and an amino group which may be substituted with an alkyl group. The following compounds are included in the formula (2).

Compound 5: Z is O; $R^{12}$ is OH; $R^4$ to $R^7$, $R^9$ to $R^{13}$ and $R^{33}$ are H Compound 6: Z is O; $R^{12}$ is OH; $R^9$, $R^{10}$, $R^{11}$ and $R^{13}$ are Br; and $R^4$ to $R^7$, $R^9$, and $R^{33}$ are H Compound 7: Z is O; $R^{12}$ is OH; $R^9$, $R^{10}$, $R^{11}$ and $R^{13}$ are I; $R^4$ to $R^7$ are Cl; and $R^{33}$ is H Compound 8: Z and $R^{12}$ are $NHC_2H_5$; and $R^4$ to $R^7$, $R^9$ to $R^{13}$ and $R^{33}$ are H Compound 9: Z and $R^{12}$ are $NHC_2H_5$; $R^4$ to $R^7$ and $R^{10}$ to $R^{12}$ are H; $R^9$ and $R^{13}$ are $CH_3$; and $R^{33}$ is $C_2H_5$ Examples of preferable electron acceptor molecules include acridinium compounds. Typical acridinium compounds are represented by the following formula (3).

Formula (3)

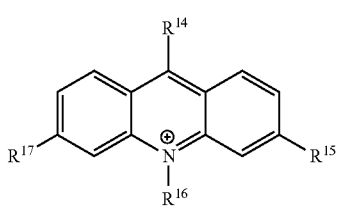

In the formula (3), $R^{14}$ to $R^{17}$ each independently represent a hydrogen atom or a substituent. Preferable substituents for $R^{14}$ to $R^{17}$ are an alkyl group, an aryl group which may be substituted with an alkyl group, or an amino group which may be substituted with an alkyl group. The following compounds are included in the formula (3).

Compound 10: $R^{16}$ is CHs; and $R^{14}$, $R^{15}$ and $R^{17}$ are H

Compound 11: $R^{16}$ is CHs; $R^{14}$ is $C_6H_5$; and $R^{15}$ and $R^{17}$ are H Compound 12: $R^{16}$ is CHs; $R^{14}$ is mesityl: and $R^{15}$ and $R^{17}$ are H Compound 13: $R^{16}$ is H; $R^{14}$ is H: and $R^{15}$ and $R^{17}$ are $N(CH_3)_2$ Compound 14: $R^{16}$ is $CH_3$; $R^{14}$ is H; and $R^{15}$ and $R^{17}$ are $NH_2$ Compound 15: $R^{16}$ is H; $R^{14}$ is H; and $R^{15}$ and $R^{17}$ are $NH_2$ Examples of preferable electron acceptor molecules include thiazine compounds. Typical thiazine compounds are represented by the following formula (4).

Formula (4)

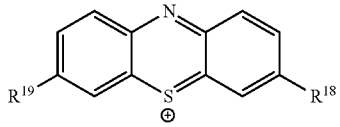

In the formula (4), $R^{18}$ and $R^{19}$ each independently represent a hydrogen atom or a substituent. Preferable substituents for $R^{18}$ and $R^{19}$ are an amino group which may be substituted with an alkyl group. The following compound is included in the formula (4).

Compound 16: $R^{18}$ and $R^{19}$ are $N(CH_3)_2$

As a thiazine derivative, 10-phenylphenothiazine is also exemplified.

In the case that p-type OLPL is fabricated, the electron acceptor molecule content of the long persistent luminescence emitter, based on the total amount by mole of the electron donor molecules and the electron acceptor molecules, is preferably less than 30 mol %, more preferably less than 20 mol %, further preferably less than 10 mol %, still further preferably less than 5 mol %, for example less than 2 mol %. The electron acceptor molecule content of the long persistent luminescence emitter, based on the total amount by mole of the electron donor molecules and the electron acceptor molecules, is preferably at least 0.001 mol %, more preferably at least 0.01 mol %, further preferably at least 0.1 mol %.

In the case that n-type OLPL is fabricated, the electron acceptor molecule content of the long persistent luminescence emitter, based on the total amount by mole of the electron donor molecules and the electron acceptor molecules, is preferably at least 70 mol %, more preferably at least 80 mol %, further preferably at least 90 mol %, still further preferably at least 95 mol %, for example at least 98 mol %. The electron acceptor molecule content of the long persistent luminescence emitter, based on the total amount by mole of the electron donor molecules and the electron acceptor molecules, is preferably less than 99.999 mol %, more preferably less than 99.99 mol %, further preferably less than 99.9 mol %. The electron acceptor molecule in n-type OLPL preferably has a high glass transition temperature Tg so that the molecules can exist in the glass state at room temperature, and the electron acceptor molecule is preferably a molecule from which a high film density can be obtained when a film is formed. When the density of the electron acceptor molecules in a film is high, electrons are easily diffused from LUMO to LUMO of the electron acceptor molecules after a charge-separated state is generated, and the recombination of electrons and holes can be caused with a high probability.

(Electron Donor Molecule)

The electron donor molecule constituting the long persistent luminescence emitter is stable in an oxidized state, particularly in a radical cation state, and can exhibit persistent luminescence at 10 K when it is combined with an electron acceptor molecule. For example, a molecule which forms an exciplex with an electron acceptor molecule at 10 K (and preferably also at 20° C.) and emits light can be selected. It is preferable that the HOMO level of the electron donor molecule is higher than the HOMO level of the electron acceptor molecule and that the LUMO level is higher than the LUMO level of the electron acceptor molecule. Due to this, an electron moves easily from the HOMO or LUMO of the electron donor molecule to the HOMO or the LUMO of the electron acceptor molecule, and a hole moves from the HOMO of the electron acceptor molecule to the HOMO of the electron donor molecule. A charge-separated state can be generated efficiently. Specifically, the HOMO level of the electron donor molecule is higher than the HOMO level of the electron acceptor molecule by 0.01 eV or more, more preferably by 0.1 eV or more, further preferably by 0.2 eV or more, still more preferably by 0.3 eV or more, still more preferably by 0.4 eV or more. The difference between the HOMO level of the electron donor molecule and the HOMO level of the electron acceptor molecule is preferably 1.5 eV or less. The LUMO level of the electron donor molecule is preferably higher than the LUMO level of the electron acceptor molecule by 0.5 eV or more, for example 1.0 eV or more, or 1.5 eV or more. The HOMO level of the electron donor molecule is preferably −4.0 to −8.0 eV, more preferably −4.5 to −7.0 eV, further preferably −5.0 to −6.0 eV, for example −5.5 to −6.0 eV.

The HOMO and LUMO levels of the electron donor molecule can be measured by photoemission spectroscopy, cyclic voltammetry, and absorption spectroscopy.

In view of the stability of the oxidized state, particularly the radical cation, as the electron donor molecule, a compound having an electron donor group is preferably used, and a compound having a conjugated system with an electron donor group is more preferably used. A compound having a dialkylamino group and an aromatic ring or a compound having a diphenylamino group (including a compound in which the two phenyl groups constituting the diphenylamino group are bound to each other) is further preferably used.

When the electron donor molecule is a compound having a dialkylamino group and an aromatic ring, the aromatic ring may be an aromatic hydrocarbon or an aromatic heterocycle but is preferably an aromatic hydrocarbon. The aromatic ring is preferably a benzene ring or a biphenyl ring, more preferably a biphenyl ring. The aromatic ring may have a substituent. The dialkylamino group is preferably substituted to the aromatic ring. The number of the dialkylamino groups contained in the electron donor molecule may be one, two or more but is preferably one to four, more preferably two or four, further preferably two. The alkyl groups of the dialkylamino group may have a substituent.

The electron donor molecule is preferably a compound represented by the following formula (5).

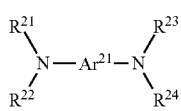

Formula (5)

In the formula (5), $Ar^{21}$ represents a substituted or unsubstituted arylene group. $Ar^{21}$ is preferably a substituted or unsubstituted phenylene group or a substituted or unsubstituted biphenyldiyl group, more preferably a substituted or unsubstituted biphenyldiyl group. The aryl group may be a monocyclic ring, a condensed ring formed by condensation of two or more aromatic rings or linked rings formed by two or more linked aromatic rings. When two or more aromatic rings are linked, the rings may be linked linearly or linked in a branch structure. The number of the carbon atoms of the aromatic ring constituting the arylene group is preferably 6 to 40, more preferably 6 to 22, further preferably 6 to 18, still further preferably 6 to 14, particularly preferably 6 to 10.

Specific examples of the arylene group include phenylene group, naphthalenediyl group and biphenyldiyl group.

$R^{21}$ to $R^{24}$ each independently represent a substituted or unsubstituted alkyl group. $R^{21}$ to $R^{24}$ may be the same or different from each other. The alkyl group of $R^{21}$ to $R^{24}$ may be any of linear, branched and cyclic groups. The number of the carbon atoms is preferably 1 to 20, more preferably 1 to 10, further preferably 1 to 6. Examples include methyl group, ethyl group, n-propyl group, isopropyl group and the like. Examples of the substituent which the alkyl group may have include an aryl group having 6 to 40 carbon atoms, a heteroaryl group having 3 to 40 carbon atoms, an alkenyl group having 2 to 10 carbon atoms, an alkynyl group having 2 to 10 carbon atoms and the like. These substituents may further have a substituent.

Preferable compounds which can be used as the electron donor molecule are shown below. In this regard, however, the electron donor molecules which can be used in the invention should not be construed as being limited by these specific examples.

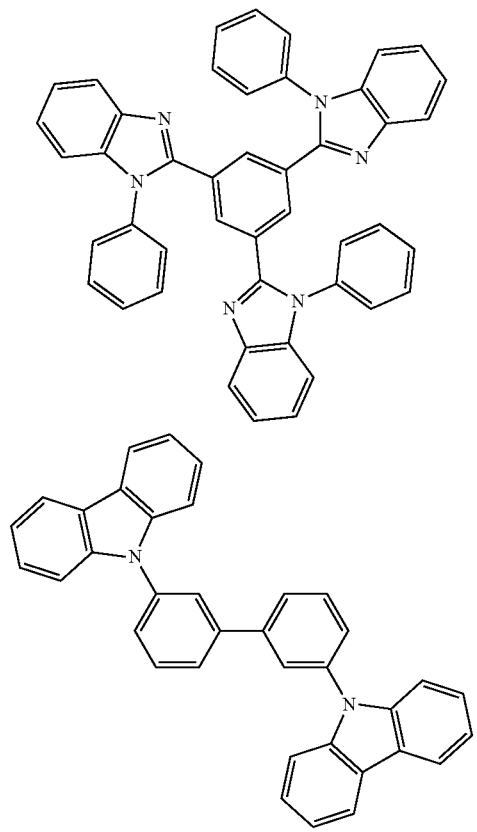 [SMILES: c1ccc(-n2c(-c3cc(-c4nc5ccccc5n4-c4ccccc4)cc(-c4nc5ccccc5n4-c4ccccc4)c3)nc3ccccc32)cc1 ; c1cc(-c2cccc(-n3c4ccccc4c4ccccc43)c2)cc(-n2c3ccccc3c3ccccc32)c1]

The electron donor molecule used in the invention may be a polymer obtained by introducing a polymerizable group to the electron donor molecule as a single element and polymerizing it as a monomer. A specific example of the polymer which can be used as the electron donor molecule is a polymer having the following structure. In the following formula, n is an integer of one or larger. In this regard, however, the polymers which can be used as the electron donor molecule in the invention should not be construed as being limited by the specific example.

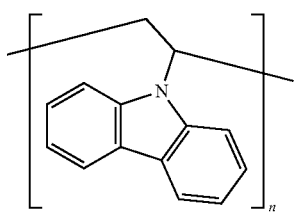

In the case that p-type OLPL is fabricated, the electron donor molecule content of the long persistent luminescence emitter, based on the total amount by mole of the electron donor molecules and the electron acceptor molecules, is preferably at least 70 mol %, more preferably at least 80 mol %, further preferably at least 90 mol %, still further preferably at least 95 mol %, for example at least 98 mol %. The electron donor molecule content of the long persistent luminescence emitter, based on the total amount by mole of the electron donor molecules and the electron acceptor molecules, is preferably less than 99.999 mol %, more preferably less than 99.99 mol %, further preferably less than 99.9 mol %. The electron donor molecule in p-type OLPL preferably has a high glass transition temperature Tg so that the molecules can exist in the glass state at room temperature, and the electron donor molecule is preferably a molecule from which a high film density can be obtained when a film is formed. When the density of the electron donor molecules in a film is high, holes are easily diffused from HOMO to HOMO of the electron donor molecules after a charge-separated state is generated, and the recombination of electrons and holes can be caused with a high probability.

In the case that n-type OLPL is fabricated, the electron donor molecule content of the long persistent luminescence emitter, based on the total amount by mole of the electron donor molecules and the electron acceptor molecules, is preferably less than 30 mol %, more preferably less than 20 mol %, further preferably less than 10 mol %, still further preferably less than 5 mol %, for example less than 1 mol %. The electron donor molecule content of the long persistent luminescence emitter, based on the total amount by mole of the electron donor molecules and the electron acceptor molecules, is preferably at least 0.001 mol %, more preferably at least 0.01 mol %, further preferably at least 0.1 mol %.

(Hole Trap Material)

The long persistent luminescence emitter of the invention may be composed only of the electron acceptor molecules and the electron donor molecules but may contain another component or a solvent for dissolving the electron acceptor molecules, the electron donor molecules and the other component.

The long persistent luminescence emitter of the invention may contain a hole trap material in addition to the electron donor molecules and the electron acceptor molecules. When a hole trap material is added, holes move from the electron donor molecules in an oxidized state generated by charge separation to the hole trap material, and holes can be accumulated more stably in the hole trap material. The holes accumulated in the hole trap material return to the electron donor molecules by energy such as heat and photostimulation and recombine at the interface with the electrons in the electron acceptor molecules, and long persistent luminescence can be obtained.

The hole trap material is preferably a material having a HOMO level that is close to the HOMO level of the electron donor molecule. The HOMO level of the hole trap material is preferably higher than the HOMO level of the electron donor molecule by 0.01 eV or more, more preferably by 0.1 eV or more, further preferably by 0.2 eV or more, still further preferably by 0.3 eV or more. The difference between the HOMO level of the hole trap material and the HOMO level of the electron donor molecule is preferably 0.9 eV or less. The LUMO level of the hole trap material is preferably higher than the LUMO level of the electron donor molecule by 0.01 eV or more, for example 0.1 eV or more. In some embodiments of the invention, the LUMO level of the hole trap material is from −1.0 eV to −2.5 eV, for example −1.5 eV to −2.2 eV, and the HOMO level of the hole trap material is from −4.0 eV to −6.0 eV, for example −4.5 eV to −5.5 eV.

The hole trap material may be added in an amount of at most 10 mol %, preferably at most 5 mol %, more preferably at most 2 mol % and at least 0.01 mol %, preferably at least 0.1 mol % based on the total amount by mole of the electron donor molecule, the electron acceptor molecule and the hole trap material.

(Electron Trap Material)

The long persistent luminescence emitter of the invention may contain an electron trap material in addition to the electron donor molecules and the electron acceptor molecules. When an electron trap material is added, electrons move from the electron acceptor molecules in a reduced state generated by charge separation to the electron trap material, and electrons can be accumulated more stably in the electron trap material. The electrons accumulated in the electron trap material return to the electron acceptor molecules by energy such as heat and photostimulation and recombine at the interface with the holes in the electron donor molecules, and long persistent luminescence can be obtained.

The electron trap material is preferably a material having a LUMO level that is close to the LUMO level of the electron acceptor molecule. The LUMO level of the electron trap material is preferably lower than the LUMO level of the electron acceptor molecule by 0.01 eV or more, more preferably by 0.1 eV or more, further preferably by 0.2 eV or more, still further preferably by 0.3 eV or more. The difference between the LUMO level of the electron trap material and the LUMO level of the electron acceptor molecule is preferably 0.9 eV or less. The HOMO level of the electron trap material is preferably lower than the HOMO level of the electron acceptor molecule by 0.01 eV or more, for example 0.1 eV or more. In some embodiments of the invention, the LUMO level of the electron trap material is from −3.6 eV to −5.5 eV, for example −4.0 eV to −5.0 eV, and the HOMO level of the electron trap material is from −6.5 eV to −8.0 eV, for example −7.0 eV to −7.5 eV.

The electron trap material may be added in an amount of at most 10 mol %, preferably at most 5 mol %, more preferably at most 2 mol % and at least 0.01 mol %, preferably at least 0.1 mol % based on the total amount by mole of the electron donor molecule, the electron acceptor molecule and the electron trap material.

(Luminescent Material)

The long persistent luminescence emitter of the invention may contain a luminescent material in addition to the electron donor molecules and the electron acceptor molecules. Examples of the luminescent material include luminescent materials, such as fluorescent materials, phosphorescent materials and luminescent materials which exhibit delayed fluorescence (delayed fluorescent materials). Here, "delayed fluorescence" means fluorescence from a compound which has been brought into an excited state by energy supply and is exhibited when reverse intersystem crossing is caused from the excited triplet state to the excited singlet state and then the excited singlet state returns to the ground state. The delayed fluorescence is fluorescence observed after fluorescence from directly generated excited singlet state (general fluorescence, which is fluorescence other than the delayed fluorescence). "Fluorescent material" is a light-emitting material whose emission intensity of fluorescence is higher than the emission intensity of phosphorescence thereof at room temperature; "phosphorescent material" is a light-emitting material whose emission intensity of phosphorescence is higher than the emission intensity of fluorescence thereof at room temperature; and "delayed fluorescent material" is a light-emitting material that emits both fluorescence having a short emission lifetime and fluorescence having a long emission lifetime (delayed fluorescence) at room temperature. General fluorescence (fluorescence other than delayed fluorescence) has an emission lifetime on an nano-second (ns) order, and phosphorescence generally has an emission lifetime on an micro-second (ms) order, and accordingly, fluorescence and phosphorescence can be differentiated from each other in point of the emission lifetime thereof. A light-emitting organic compound other than organic metal complexes is a general fluorescent material or a delayed fluorescent material.

In some embodiments of the invention, a luminescent material is selected from organic compounds, particularly organic compounds having no metal element.

When a phosphorescent material is added to the long persistent luminescence emitter, the proportion of phosphorescence exhibited from the long persistent luminescence emitter can be increased, and the proportion of phosphorescence can also be made 100%.

When a delayed fluorescent material is added to the long persistent luminescence emitter, reverse intersystem crossing from the excited triplet energy state to the excited singlet energy state may be caused in the delayed fluorescent material. Thus, the proportion of fluorescence exhibited from the long persistent luminescence emitter can be increased, and the proportion of fluorescence can also be made 100%.

Known materials can be selected and used as the phosphorescent material and the delayed fluorescent material added to the long persistent luminescence emitter.

When a phosphorescent material and a delayed fluorescent material are added to the long persistent luminescence emitter, the amounts of the phosphorescent material and the delayed fluorescent material, based on the total amount by mole of the electron donor molecule, the electron acceptor molecule, the hole trap material and the luminescent material, are each preferably less than 30 mol %, more preferably less than 20 mol %, further preferably 0.001 to 10 mol %, for example 0.001 to 1 mol %. By changing the luminescent material content of the long-persistent luminescent composition, the emission wavelength of the long-persistent luminescent composition can be controlled.

When a luminescent material is added to the long persistent luminescence emitter, the wavelength of the emitted light can be regulated. The emission wavelength of the luminescent material can be selected from, for example, a visible region or a near-infrared region. Specifically, the emission wavelength of the luminescent material is preferably 200 to 2000 nm. For example, the emission wavelength may be selected from a wavelength region of 400 nm or more, 600 nm or more, 800 nm or more, 1000 nm or more, or 1200 nm or more, and may be selected from a region of 1500 nm or less, 1100 nm or less, 900 nm or less, 700 nm or less, or 500 nm or less. Preferably, the luminescent material also has a carrier-trapping function, particularly hole trapping function.

(Embodiments of Luminescence)

When light is applied, the long persistent luminescence emitter of the invention continues to exhibit luminescence for a long time even after the photo-irradiation stops.

In some preferable embodiments of the invention, the luminescence from the long persistent luminescence emitter includes at least luminescence from an exciplex formed by an electron donor molecule associated with an electron acceptor molecule or luminescence from the luminescent molecule added as the other component (at least one of the fluorescent materials, the phosphorescent materials and the delayed fluorescent materials), and the luminescence may include luminescence from electron donor molecules which are not associated with the electron acceptor molecules or luminescence from electron acceptor molecules which are not associated with the electron donor molecules. The emitted light may either fluorescence or phosphorescence or both fluorescence and phosphorescence and may further include delayed fluorescence.

The excitation light for obtaining persistent luminescence from the long persistent luminescence emitter may be sunlight or light from an artificial light source which emits light in a specific wavelength range. Wider range of wavelengths can be used as excitation light in the invention. For example, the long persistent luminescence emitter of the invention may be excited by light at 600 nm.

The photo-irradiation time for obtaining persistent luminescence from the long persistent luminescence emitter is preferably one microsecond or longer, more preferably one millisecond or longer, further preferably one second or longer, still further preferably 10 seconds or longer. With the photo-irradiation time, electron donor molecules in an oxidized state and electron acceptor molecules in a reduced state can be generated sufficiently, and luminescence continues for a long time after the photo-irradiation stops.

(Forms of Long Persistent Luminescence Emitter)

The form of the long persistent luminescence emitter of the invention is not particularly limited as long as the long persistent luminescence emitter has the electron acceptor molecule and the electron donor molecule. Therefore, a blend of the electron acceptor molecules and the electron donor molecules may be used, or an emitter in which the electron acceptor molecules and the electron donor molecules are in separated areas may also be used. A blend of the electron acceptor molecules and the electron donor molecules is preferable. Examples of the blend of the electron acceptor molecules and the electron donor molecules include a solution obtained by dissolving the electron acceptor molecules and the electron donor molecules in a solvent and a thin film containing the electron acceptor molecules and the electron donor molecules (a long persistent luminescent film).

A thin film obtained using the electron acceptor molecules and the electron donor molecules may be formed by a dry process or a wet process. For example, the thin film may be a thin film in the glass state obtained by adding the electron donor molecules to heat melted electron acceptor molecules, blending them and cooling the blend. The solvent used for forming the film by a wet process may be an organic solvent having the compatibility with the solutes, namely the electron acceptor molecules and the electron donor molecules.

Using an organic solvent, for example, it is possible to prepare a blend solution of the electron acceptor molecules and the electron donor molecules, prepare a solution obtained by dissolving the electron acceptor molecules only or prepare a solution obtained by dissolving the electron donor molecules only. When the blend solution is applied on a support and dried, a blend thin film of the electron acceptor molecules and the electron donor molecules can be formed. When the solution of the electron acceptor molecules and the solution of the electron donor molecules are applied one by one on a support and dried, a thin film of the electron acceptor molecules and a thin film of the electron donor molecules can also be formed in a manner that the films are in contact with each other (the solution of the electron acceptor molecules and the solution of the electron donor molecules are applied in any order).

The plane shape of the thin film can be determined appropriately according to the application and may be, for example, a polygon such as squares and rectangles, a continuous shape such as circles, ellipses, ovals and semicircles or a specific pattern corresponding to a geometric pattern, a letter, a figure or the like.

(Long Persistent Luminescent Element)

The long persistent luminescent element of the invention has the long persistent luminescence emitter of the invention. In some embodiments of the invention, the long persistent luminescence emitter of the invention is formed on a support. The long persistent luminescence emitter is generally formed in a film shape on the support. The film formed on the support may be a single-layer film or a multi-layer film. The single-layer film or a part of the layers of the multi-layer film can be a film containing both of the electron acceptor molecules and the electron donor molecules. Moreover, a part of the layers of the multi-layer film can be a film which contains the electron acceptor molecules but does not contain the electron donor molecules, and a part of the layers can be a film which contains the electron donor molecules but does not contain the electron acceptor molecules. Here, the two kinds of layer can be arranged in a manner that they are in contact with each other.

The corresponding descriptions in the section of the long persistent luminescence emitter can be referred to for the long persistent luminescence emitter here. The descriptions of the thin film in the section of the forms of the long persistent luminescence emitter can be referred to for the forms of the long persistent luminescent film.

The support is not particularly limited and may be any support which is usually used for long persistent luminescent materials. Examples of the material of the support include paper, metals, plastic, glass, quartz, silicon and the like. Because the film can be formed also on a flexible support, various shapes can be obtained according to the application.

The long persistent luminescent film is preferably entirely covered with a sealant. As the sealant, a transparent material which has low water or oxygen permeability, such as glass or epoxy resins, can be used.

According to the invention, a transparent long persistent luminescence emitter can be provided. Accordingly, unlike the conventional inorganic materials, the long persistent luminescence emitter can be used and applied for various applications. For example, when the transparent long persistent luminescence emitter of the invention is sandwiched between two supports made of a transparent material such as glass, a transparent long persistent luminescent plate and the like can be formed. When the transparency of the supports is regulated, a semitransparent long persistent luminescent plate can be also obtained. Moreover, according to the invention, by laminating transparent long persistent luminescent films which emit light of different colors, the color of the light emitted to outside can be adjusted.

(Applications of Long Persistent Luminescent Composition)

The long persistent luminescent emitter can be produced by simply blending the electron donor molecules and the electron acceptor molecules to form along persistent luminescent composition and applying the composition. The composition may contain a solvent. While inorganic long persistent luminescent materials constitute a long persistent luminescent product through steps of firing of the inorganic materials containing rare elements at a high temperature, formation into fine particles and dispersion, the long persistent luminescent composition of the invention has the following advantages over the inorganic long persistent luminescent materials: preparation of the materials is easy: the production costs of the long persistent luminescent product can be kept low; and transparency, flexibility and softness can be given to the long persistent luminescent product. Thus, the long persistent luminescent composition of the invention can achieve entirely new applications, in addition to the use as a general long persistent luminescent product, making use of the characteristics.

For example, by appropriately selecting the electron donor molecules and the electron acceptor molecules, the long persistent luminescent composition of the invention can emit light with a specific wavelength in a broad wavelength region ranging from blue light to near infrared rays. The luminous flux of the light emitted from a long persistent luminescent composition which emits green light is strong in the green region, and thus the composition can be used effectively as a long persistent luminescent paint for signs. A long persistent luminescent composition which emits light in the red to near infrared region is useful as a labeling material used for bioimaging because light in the wavelength region easily penetrates a living body. Moreover, using a combination of long persistent luminescent compositions emitting light of various colors, articles with excellent designs can be provided, and the compositions can be applied to a system for preventing official document forgery such as passports and the like.

A long persistent luminescent paint which can be excellently applied can be obtained by dissolving the long persistent luminescent composition of the invention in a solvent. When such a long persistent luminescent paint is applied on the entire surfaces of roads or interior surfaces of buildings, large-scale long persistent luminescent lighting which does not require any power source can be obtained. When edge lines of roads are drawn with the long persistent luminescent paint, the edge lines can be recognized also in the dark, and the safety of traffics can be improved significantly.

Moreover, when safety guidance signs drawn with the long persistent luminescent paint are used, safe escape guidance can be achieved for a long time during a disaster. An escape system for a disaster can be constructed by coating energy-saving lights, housing materials, railroads, mobile devices or the like with the long persistent luminescent paint.

A long persistent luminescent paint containing the long persistent luminescent composition of the invention can also be used as printing ink. As a result, prints with excellent designs which can be used also for guidance in the dark or during a disaster can be obtained. Such ink for long persistent luminescent printing can be preferably used, for example, for printing for covers, packages, posters, POP, stickers, signboards, escape guidance signs, safety goods and crime prevention goods.

A long persistent luminescent molded article can be obtained using a long persistent luminescent composition in which at least any of the electron acceptor molecules, the electron donor molecules, the hole trap compound and the luminescent compound is a polymer (a long persistent luminescent polymer) or using a composition obtained by adding a commercial semiconducting polymer to the long persistent luminescent composition of the invention.

Examples of such a long persistent luminescent molded article include lighted signs, product displays, liquid crystal back lights, lighting displays, covers for lighting fixtures, traffic signs, safety signs, parts for improving night visibility, signboards, screens, automobile parts such as reflecting plates and meter parts, equipment and toys in amusement facilities and mobile devices such as laptops and mobile phones, as well as sign buttons in automobiles or buildings, watch and clock dials, accessories, stationery products, sports goods, housings, switches and buttons in the field of various electric, electronic and OA devices and the like.

Because the transparency of the long persistent luminescent composition of the invention is excellent, a window for lighting control having the long persistent luminescence properties can be obtained by coating a surface of glass with the long persistent luminescent composition or forming a thin plate with a blend of the long persistent luminescent composition and a resin. Moreover, when a thin plate made of the long persistent luminescent composition and a reflecting plate are laminated, a long persistent luminescent plate with high brightness can be obtained. Such a long persistent luminescent plate can be used as a luminescent guiding tile for parts for evacuation routes for disasters, plates for stairs, risers, frame materials, ditch cover materials, parts for open parking lots, maintenance parts for harbors, safety parts for road facilities, scaffold parts for works at high places, scaffold parts for facilities floating in the sea, parts related to trails in mountains, salt damage resistant weather resistant signboards and the like.

By coating fibers with the long persistent luminescent composition of the invention, long persistent luminescent fibers, fabrics using the fibers and long persistent luminescent clothes can be obtained. Such long persistent luminescent fiber products include workwear for night, hats, carpets for emergency paths, bridal clothes, tapestries, interior materials for cars and the like.

In addition, the long persistent luminescent composition of the invention can constitute various materials such as long persistent luminescent films, long persistent luminescent tapes, long persistent luminescent stickers, long persistent luminescent building materials and long persistent luminescent sprays. In all the cases, because each component can be composed of an organic compound, there is a wide choice of colors, and transparency and softness can be given to the materials. Thus, the designs, the properties as signs and the handleability can be made excellent. For example, long persistent luminescent films can be widely used as packaging materials of escape guidance and emergency supplies.

The charge-separated state of the long persistent luminescence emitter of the invention lasts long. Thus, the long persistent luminescence emitter can be used for various applications in a wide variety of fields. For example, the long persistent luminescence emitter of the invention can be applied to the field of artificial photosynthesis in which a charge-separated state is generated by light energy, leading to the production of a substance. Moreover, the long persistent luminescence emitter of the invention can be used effectively as an element responding to thermal energy or mechanical energy. An example of an element responding to thermal energy is thermal switching in which the long persistent luminescence emitter is brought into the charge-separated state by applying excitation light and then caused to emit light momentarily by heating. Examples of an element responding to mechanical energy include an element which emits light when mechanical energy such as pressure is applied to the long persistent luminescence emitter in the charge-separated state and an element whose luminescence state changes when mechanical energy such as pressure is applied to the long persistent luminescence emitter in the charge-separated state.

EXAMPLES

The characteristics of the invention are explained more specifically below using Examples. The materials, the contents of the treatment, the treatment procedures and the like shown below can be appropriately modified as long as the modifications do not depart from the purposes of the invention. Thus, the scope of the invention should not be construed as being limited by the specific examples shown below.

(Materials)

TPP$^+$, MeOTPP$^+$, and m-MTDATA were obtained from MERCK (Darmstadt, Germany). TPBi and mCBP were obtained from TCI Chemical (Tokyo, Japan). PPT was synthesized according to literature[43].

(Film Fabrication)

In a nitrogen-filled glovebox, mixtures of electron donors and acceptors were placed on a template glass substrate owing 100 mm$^2$ surface area with 0.5 mm depth and heated up to 28° C. for 10 seconds. After melting, the substrate was rapidly cooled down to room temperature.

(Optical and Electrical Measurements)

A dichloromethane solution of each material (10-5 M) was used for the measurement of absorption, fluorescence, phosphorescence, and absolute photoluminescence quantum yields ($\phi_{PL}$). The absorption spectra were measured using a UV-vis-NIR spectrophotometer (LAMBDA 950, Perkin Elmer). The photoluminescence spectra at room temperature and the phosphorescence spectra at 77 K were measured using spectrofluorometers (FP-8600, JASCO, and PMA-12, Hamamatsu Photonics). The $\phi_{PL}$ were measured using an integrating sphere with a photoluminescence measurement unit (Quantaurus-QY, C11347-01, Hamamatsu Photonics). The phosphorescence lifetime of TPP$^+$ and MeOTPP$^+$ was obtained by time resolved emission spectra at 77 K measured by spectrometers (PMA-12, Hamamatsu Photonics). Cyclic voltammetry was carried out using an electrochemical analyser (Model 608D+DPV, BAS). Measurements were performed in dried and oxygen-free DMF using 0.1 M tetrabutylammonium hexafluorophosphate as a supporting electrolyte. A platinum wire was used as a counter electrode, with glassy carbon as a working electrode, and Ag/Ag$^+$ as a reference electrode. Redox potentials were referenced against ferrocene/ferrocenium (Fc/Fc$^+$). Corresponding LUMO energies of TPP$^+$, MeOTPP$^+$, TPBi, and mCBP and HOMO energy of TCTA were calculated from first reduction or oxidation peaks using an absolute value of −4.8 eV to vacuum for the Fc/Fc$^+$ redox potential[44]. The absorption spectra of the TPP$^+$ and TCTA radical species were measured by a UV-vis-NIR spectrophotometer (UV-3600 Plus, SHIMADZU). The TPP$^+$ radicals and TCTA radical cations were generated by the electrical oxidation in a DCM solution containing 0.1 M TBAPF$_6$. The transient absorption spectra were obtained 30 seconds after photoexcitation by 365 nm LED light.

(LPL Measurements)

The LPL spectra and decay profiles were obtained using a measurement system in a glove box[12]. The fabricated films were placed in the dark box and excited by various wavelengths of LEDs with band pass filters (Thoriabs, band width±5 nm) with an excitation power of 1 mWcm$^{-2}$ and an excitation duration of 60 seconds. The PL and LPL spectra were recorded using a multichannel spectrometer (PMA-12, C14631-01, Hamamatsu Photonics). Emission decay profiles were obtained without wavelength sensitivity calibration using a silicon photomultiplier (MPPC module, C13366-1350GA, Hamamatsu Photonics). The temperature dependence and the air stability were measured in a cryostat (PS-HT-200, Nagase Techno-Engineering) connected to a turbo molecular pump (HiPace, Pfeiffer Vacuum) and excited using a 365 nm LED (M340L4, Thordabs) with a band pass filter (365 nm±5 nm) for 60 seconds. Firstly, the LPL properties were measured under the vacuum. Then, the samples were kept under air in the dark for 1 week and measured optical properties under the air.

(Thermoluminescence Measurements)

Thermoluminescence measurements were conducted in a cryostat (PS-HT-200, Nagase Techno-Engineering) connected to a turbo molecular pump (HiPace 80, Pfeiffer Vacuum). Emission spectra during (steady-state photoluminescence) and after (LPL) excitation were recorded using a multichannel spectrometer (QE-Pro, Ocean Photonics). Emission decay profiles of LPL were obtained using a Silicon photomultiplier (C13366-1350GA, Hamamatsu photonics) connected to a multimeter (34461A, Keysight).

(Details of Examples)

Figure 5:
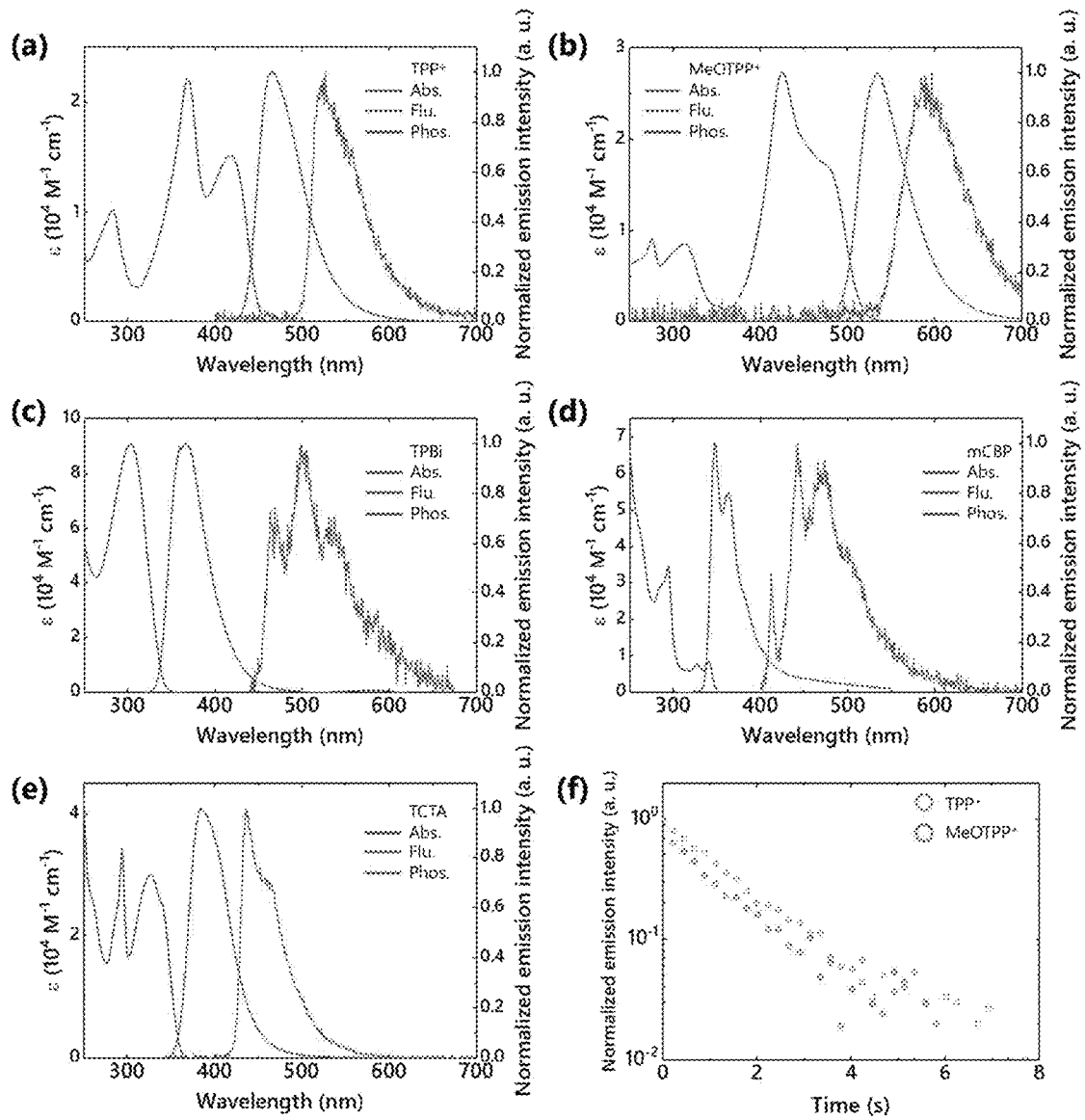

Example 1: TPP$^+$/TPBi
Example 2: TPP$^+$/mCBP
Example 3: MeOTPP$^+$/mCBP
Example 4: TPP$^+$/TPBi/TCTA Cationic photoredox catalysts, 2,4,6-triphenylpyrylium tetrafluoroborate (TPP$^+$) and 2,4,6-tris(methoxyphenyl) pyrylium tetrafluoroborate (MeOTPP$^+$), were used as electron acceptors[25-27] and semiconducting host molecules, 3,3'-di(9H-carbazol-9-yl)biphenyl (mCBP)[28] and 1,3,5-tris(1-phenyl-1H-benzimidazol-2-yl)benzene (TPBi)[29], were used as electron donors (FIG. 1c). Moreover, 4,4',4''-tri(9-carbasoyl)triphenylamine (TCTA)[30] was used as a hole trap material. UV-visible absorption, fluorescence, and phosphorescence spectra of these materials are shown in FIG. 5. Energy levels of the lowest singlet excited state ($^1$LE) and triplet excited states ($^3$LE) were estimated from the onset of fluorescence and phosphorescence spectra, respectively. The LUMO levels were obtained from the first reduction peaks of the cyclic voltammograms (CV) (FIG. 6), and the HOMO levels were estimated from the optical gap calculated from the absorption edge (FIG. 1d, Table S1). The HOMO level of TCTA was obtained from CV, and the LUMO level was estimated from the optical energy gap because of the electric window of the solvent.

The LPL films with a 1:99 molar ratio of the acceptor: donor system were fabricated by the conventional melt-casting method[10]. Steady-state photoluminescence (PL) and LPL spectra, emission decay profiles, and PL quantum yields ($\phi_{PL}$) were obtained under nitrogen gas. The triplet charge-transfer excited state ($^3$CT) level is assumed from the singlet charge-transfer excited state ($^1$CT) level obtained from the onset of the PL spectrum since most LPL systems have a very small energy gap between the $^1$CT and $^3$CT[31].

Figure 13:
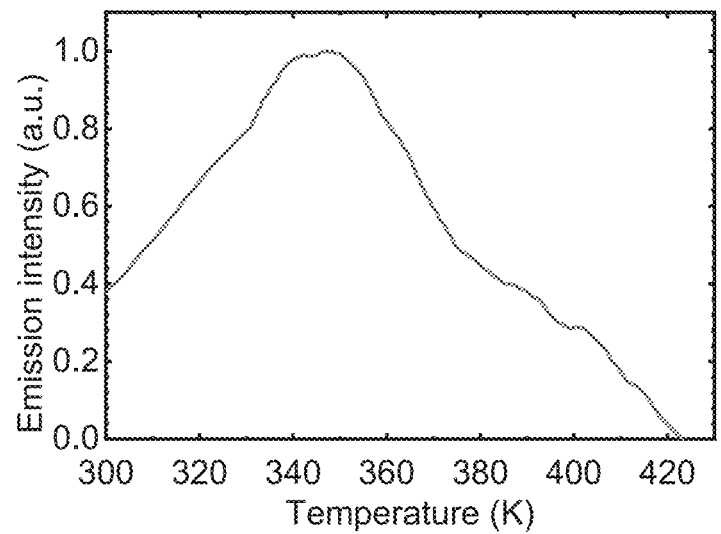
FIG. 13. Thermoluminescence curve of the TPP$^+$/TPBi film.

The TPP$^+$/TPBi film was excited by 365 nm light for 300 seconds at 300 K. The 365 nm light can only be absorbed by TPP$^+$. Ten minutes after the excitation ended, the film temperature was started to be raised from 300 K to 450 K at Kmin$^{-1}$ for thermoluminescence measurement. The emission intensity increased while the temperature rose from 300 K to about 340 K (FIG. 13). The TPP$^+$/mCBP and MeOTPP$^+$/mCBP films also show increase in emission intensity as the temperature rises from 300K, but the MeOTPP$^+$/TPBi film does not When the films were excited by 365 nm light which can only be absorbed by the acceptors, the TPP$^+$/TPBi, TPP$^+$/mCBP, and MeOTPP$^+$/mCBP films exhibited long-lasting LPL emission of which the decay profiles follow a power-law decay (FIG. 2a)[32,33]. This power-law emission decay indicates the generation of intermediate charge-separated states and successive gradual charge recombination, leading to LPL. The emission spectra of these films attributed to the charge-transfer (CT) excited states between the donors and acceptors and local fluorescence and phosphorescence of the acceptors[15,34].

Figure 7:
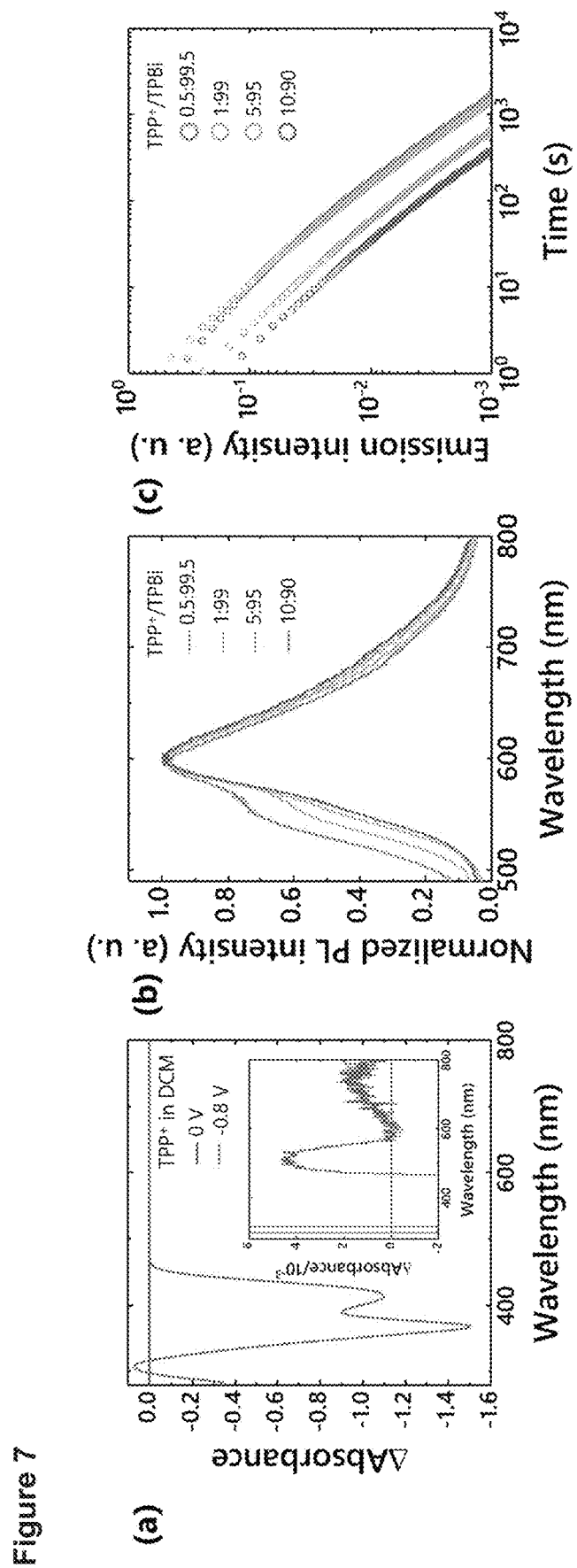
FIG. 7. (a) Absorption spectra of TPP$^+$ in DCM containing 0.1 M TBAPFs with and without electrical oxidation. Inset: Enlarged graph. The TPP$^+$ concentration dependence of the PL spectra (b) and duration (c) of TPP$^+$/TPBi film FIG. 8. Energy diagrams of (a) the TPP$^+$/TPBi film, (b) the TPP$^+$/mCBP film, (c) the MeOTPP$^+$/TPBi film, and (d) the MeOTPP$^+$/mCBP film.

The TPP$^+$/TPBi, TPP$^+$/mCBP, and MeOTPP$^+$/mCBP films form $^1$CT excited states (FIG. 2b) and the energy levels of $^1$CTs are lower than those of the locally excited states of the donors and acceptors ($^3$LE$_D$ and $^3$LE$_A$). Therefore, the LPL caused by the recombination of the accumulated charges occurs from the $^1$CT states. The TPP$^+$/TPBi film exhibits the CT emission at 603 nm with a shoulder peak at around 555 nm. The shoulder peak decreased with an increase of the TPP$^+$ concentration due to the self-absorption of TPP radical at 500-600 nm (FIG. 7a)[34-36] and it was disappeared at the higher concentration of TPP$^+$ because of a strong self-absorption of TPP radical (FIG. 7b). The TPP$^+$/TPBi film showed the longest LPL duration of 1435 seconds because of the highest $\phi_{PL}$ of 10.2%. The LPL duration was decreased as increasing the TPP$^+$ concentration because the charge recombination probability is increased at the higher concentration of TPP$^+$ (FIG. 7c).

Figure 8:
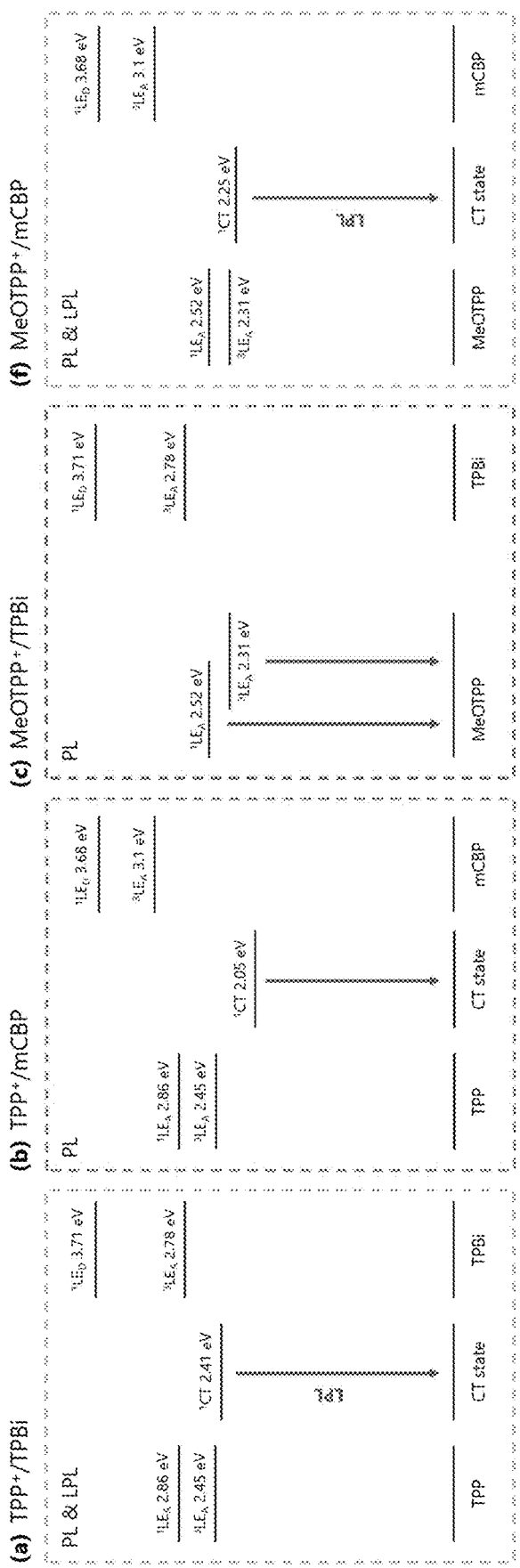
Figure 12:
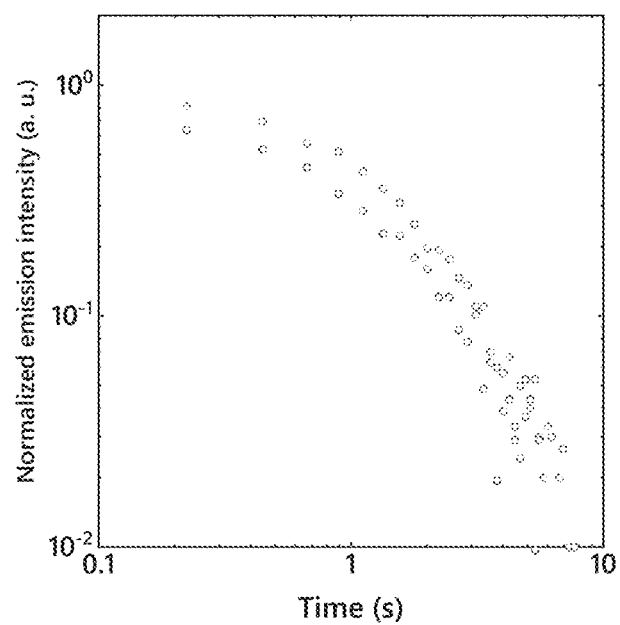
FIG. 12. Emission decay profiles of the MeOTPP$^+$/TPBi film in log-log plot.

The TPP$^+$/mCBP film exhibited broad near infra-red (NIR) emission at 731 nm because of a smaller energy gap between the LUMO of TPP$^+$ and HOMO of mCBP. Due to the very low $\phi_{PL}$ of the CT emission and low NIR sensitivity of the photodiode for detection used in this study, the LPL duration is only 19 seconds. The MeOTPP$^+$/mCBP films also exhibited only CT emission at 624 nm with the LPL duration of 605 seconds. In contrast, the MeOTPP$^+$/TPBi film does not form a CT excited state although the HOMO and LUMO levels are appropriate. The TPBi may not act as the donor due to the low HOMO level. Therefore, this film exhibits fluorescence and room temperature phosphorescence of MeOTPP$^+$ (FIG. 8c). The log-log graph of emission intensity on a logarithmic scale of y-axis and elapsed time on a logarithmic scale of x-axis shows that the emission decay does not follow a power law (FIG. 12), and the semi-log graph of the emission intensity on a logarithmic scale of the y-axis and the time of the x-axis (time on a linear scale, but not on a logarithmic scale) shows that the emission decays exponentially. These results indicate the formation of the lowest $^1$CT state is also important for efficient LPL emission in p-type OLPL systems.

Figure 2:
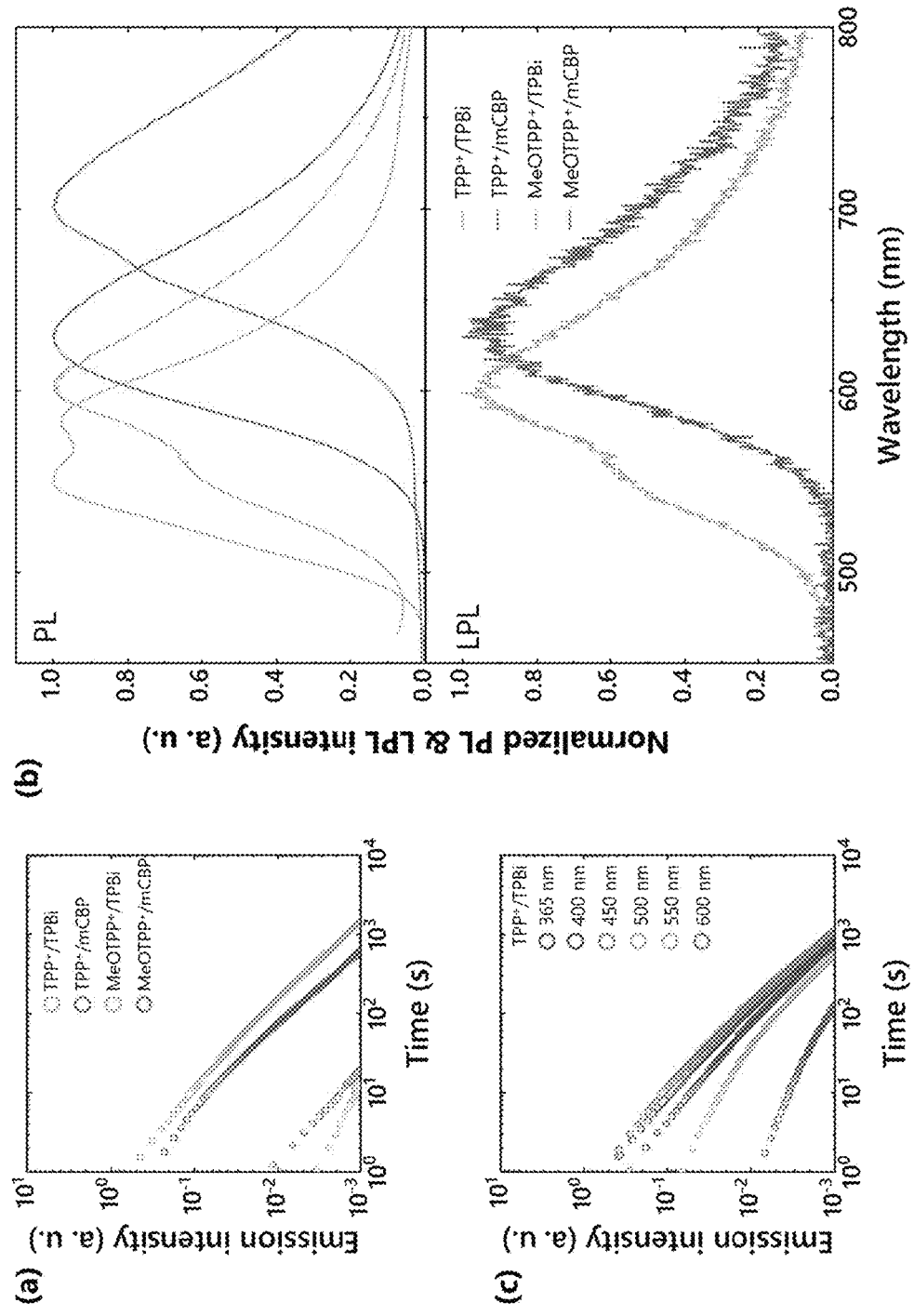
FIG. 2. Photoluminescence properties of OLPL systems under nitrogen gas. (a) Emission decay profiles of the TPP$^+$/TPBi, TPP$^+$/mCBP, MeOTPP$^+$/TPBi, and MeOTPP$^+$/mCBP films in log-log plot. (b) Steady-state photoluminescence (PL) spectra and emission spectra 10 seconds after photoexcitation (LPL). The LPL spectrum of the TPP$^+$/mCBP was not measurable due to the weak emission intensity. (c) Excitation-wavelength dependence of the emission decay profiles of the TPP$^+$/TPBi film.
Figure 9:
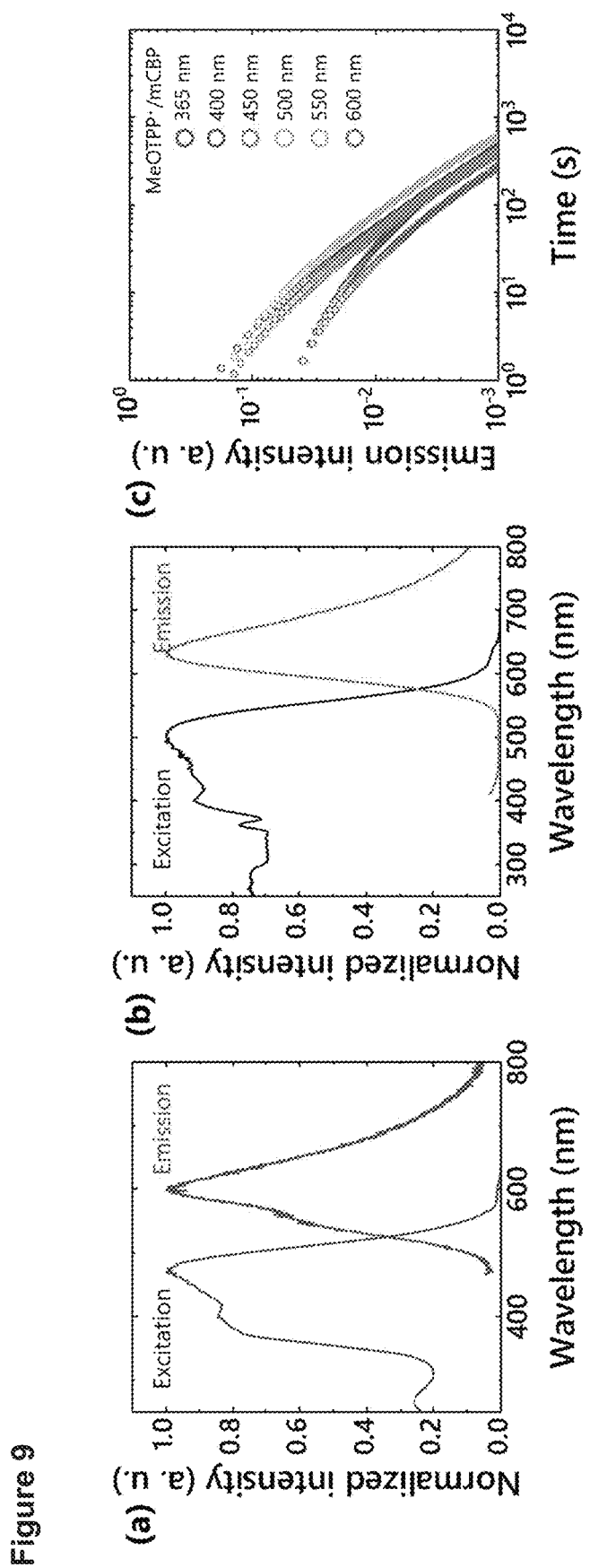
FIG. 9. Excitation and PL spectra of the TPP$^+$/TPBi (a) and MeOTPP$^+$/mCBP (b) films. Excitation spectra were obtained at 600 nm 630 nm, respectively. (c) Excitation-wavelength dependence of the emission decay profiles of the MeOTPP$^+$/mCBP film.

Because a blend film of donor and acceptor molecules has the absorption bands of donor, acceptor, and charge transfer, OLPL systems can be excited by various wavelengths. This is a major advantage over inorganic LPL systems, which are mostly limited to UV to blue excitation wavelengths. The excitation spectra of the TPP$^+$/TPBi and MeOTPP$^+$/mCBP films indicate that these films can be excited by over 600 nm (FIG. 9). To confirm the excitation wavelength dependence of LPL emission, these films were excited by 365 nm, 400 nm, 455 nm, 500 nm, 550 nm, and 600 nm-LEDs. The LPL emission was observed at all excitation wavelengths, although the LPL duration decreased, which is correlated with the absorption intensity (FIGS. 2c and S5c). The 600-nm photoexcitation and NIR LPL emission, which corresponds to the biological window, is expected to be used for bio-imaging[37].

Figure 3:
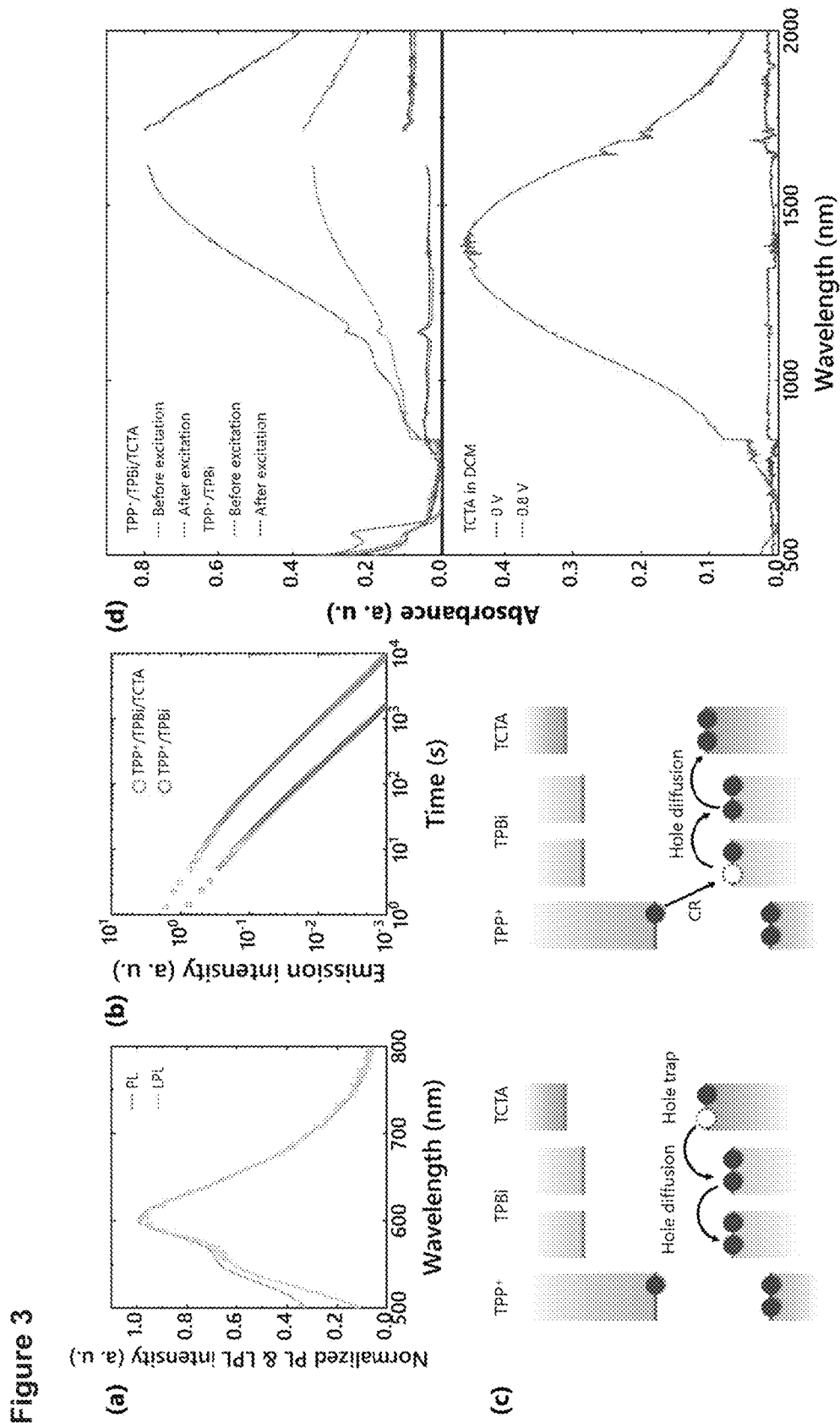
FIG. 3. Photoluminescence properties of the TPP$^+$/TPBi/TCTA film under nitrogen gas. (a) PL and LPL spectra of the TPP$^+$/TPBi/TCTA film. (b) Emission decay profiles of the TPP$^+$/TPBi and TPP$^+$/TPBi/TCTA films. (c) Emission mechanism of the TPP$^+$/TPBi/TCTA film. The TCTA molecule accepts holes from TPBi and forms radical cation since the HOMO level of TCTA is higher than that of TPBi. Thermal detrapping from TCTA re-generates the radical cations of TPBi and recombined with the TPP radical. (d) (Top) Absorption spectra of the TPP$^+$/TPBi and TPP$^+$/TPBi/TCTA films before and after photoexcitation. (Bottom) Absorption spectra of TCTA in DCM containing 0.1 M TBAPF$_6$ with and without electrical oxidation. Absorption data at 1600 nm were omitted because of the absorption of quartz substrate.
Figure 6:
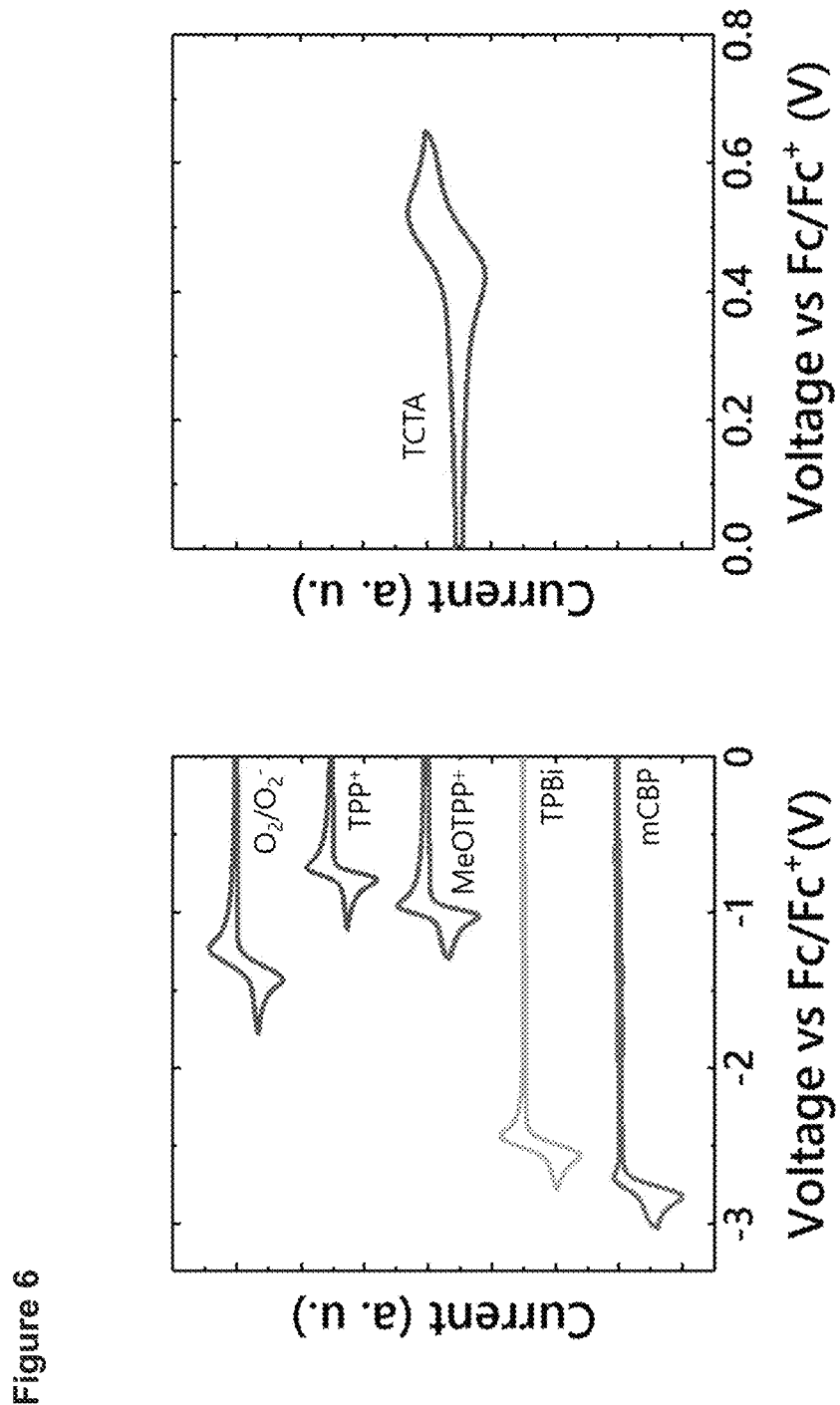
FIG. 6. UV-vis absorption, fluorescence, and phosphorescence spectra of TPP$^+$ (a), MeOTPP$^+$ (b), TPBi (c), mCBP (d), and TCTA (e) in DCM. Phosphorescence decay profiles were obtained at 77 K (f).
Figure 10:
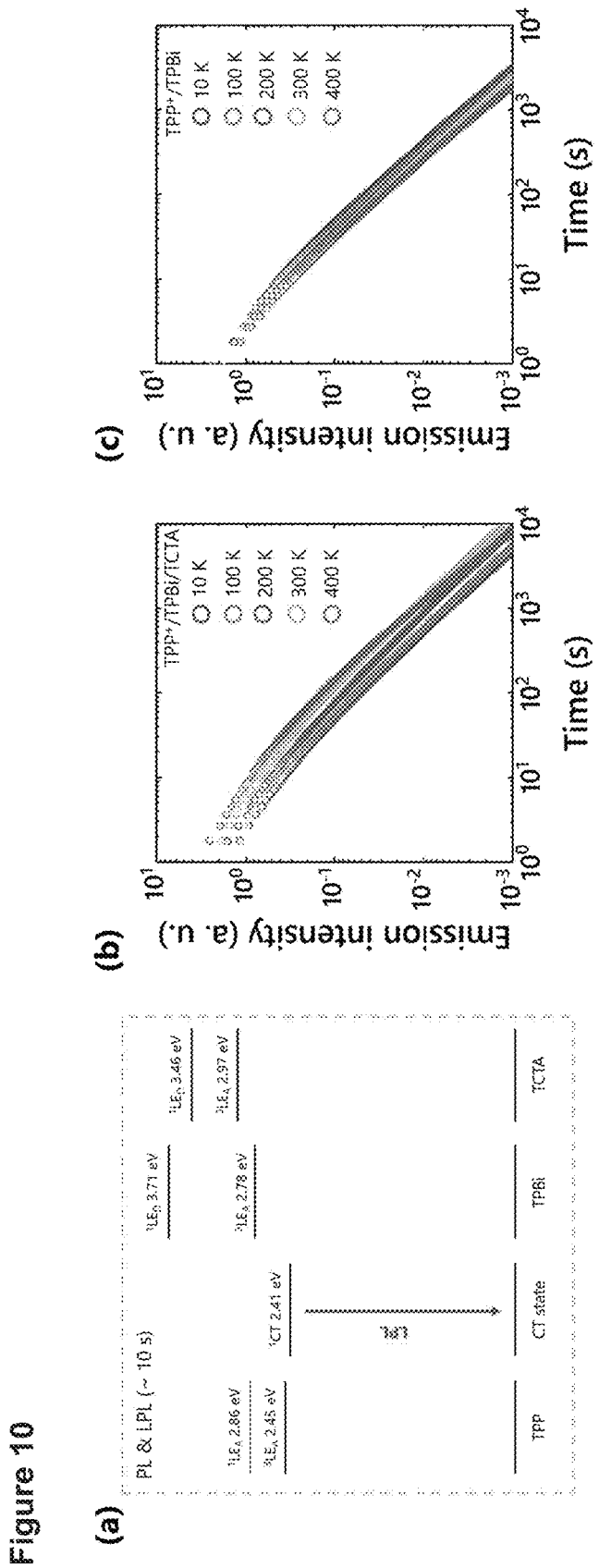
FIG. 10. (a) Energy diagram of the TPP$^+$/TPBi/TCTA. Temperature-dependence of the LPL duration of the TPP$^+$/TPBi/TCTA (b) and the TPP$^+$/TPBi (c) films.

The LPL performance was 6 times improved by adding a hole trapping material into the p-type OLPL system. In the p-type OLPL system, TCTA was doped into TPP$^+$/TPBi system since the HOMO level of TCTA (−5.3 eV) is higher than that of TPBi (−5.9 eV) (FIG. 1d and FIG. 6). The PL and LPL spectra of the TPP$^+$/TPBi/TCTA film with a 1:99:1 molar ratio were identical to those of the TPP$^+$/TPBi film (FIG. 3a) but the LPL duration was improved by 6 times, resulted in 9045 seconds (FIG. 3b). This indicates that TCTA acts as hole traps to the charge-separated state (FIG. 3c, FIG. 10a).

To confirm the hole trapping by TCTA, the transient absorption spectra of the TPP$^+$/TPBi and TPP$^+$/TPBi/TCTA films were obtained[39]. After photoexcitation, a clear broad absorption over 800 nm was observed in the TPP$^+$/TPBi/TCTA film (FIG. 3d). This peak corresponds to the radical cation of TCTA obtained in dichloromethane (DCM) under electrical oxidation, although a wavelength shift can be observed due to the polarization effect in the solid film (FIG. 3d). The hole trapping is also confirmed by the temperature dependence of the LPL duration[40]. Since the hole detrapping process is endothermic, the LPL intensity becomes larger by increasing the temperature in the TPP$^+$/TPBi/TCTA film (FIG. 10b). In contrast, the LPL duration of the TPP$^+$/TPBi film was gradually decreased with increasing temperature since the nonradiative process is enhanced at high temperature (FIG. 10c). Thus, the detrapping effect in the TPP$^+$/TPBi/TCTA film for LPL intensity overwhelmed the nonradiative process at the measured temperatures.

Figure 4:
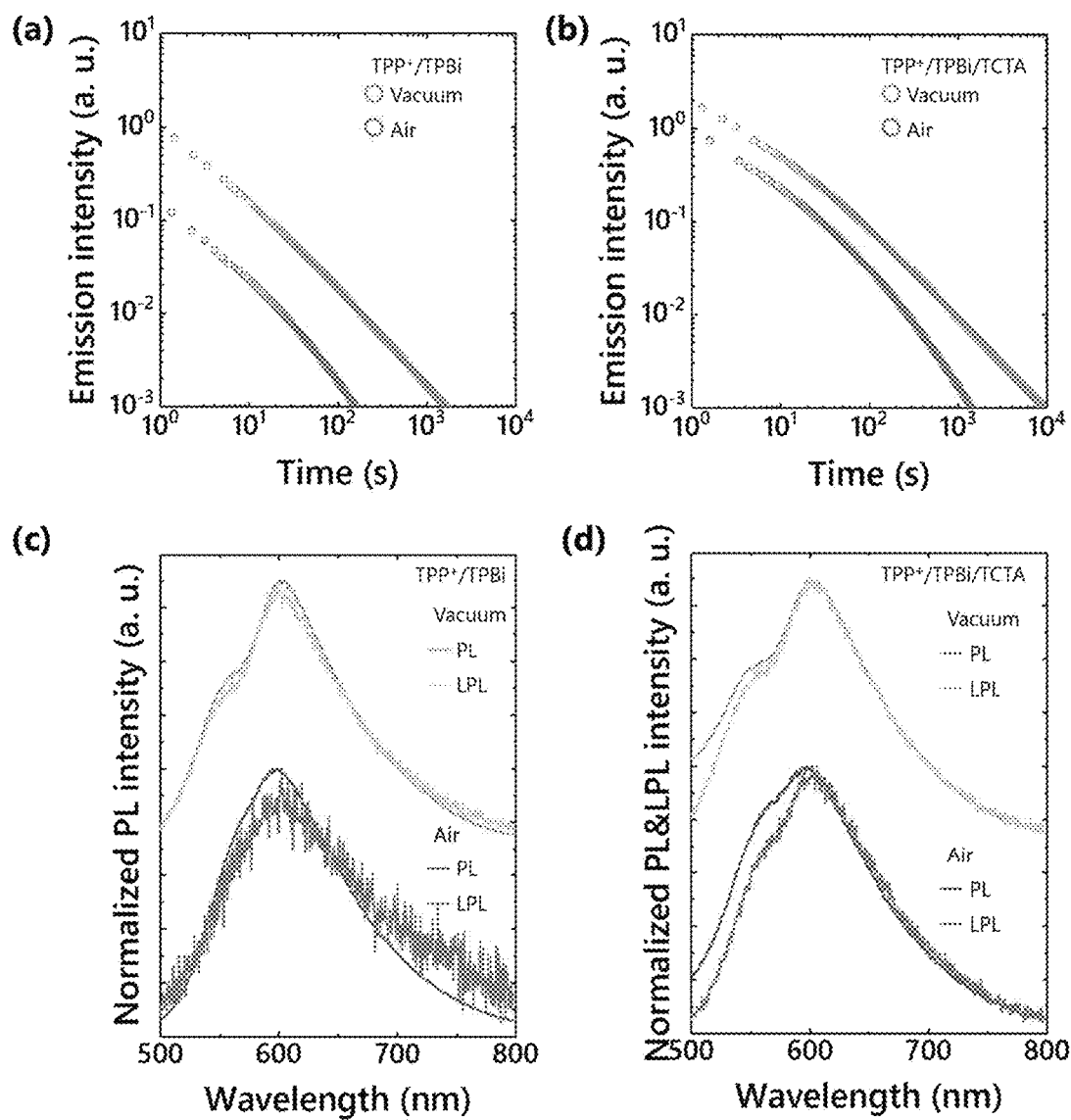
FIG. 4. Optical properties of the OLPL systems in the air. The LPL duration in the vacuum and in the air of the TPP$^+$/TPBi (a) and TPP$^+$/TPBi/TCTA (b) films. The PL and LPL spectra in the vacuum and in the air of the TPP$^+$/TPBi (c) and TPP$^+$/TPBi/TCTA (d) films.
Figure 11:
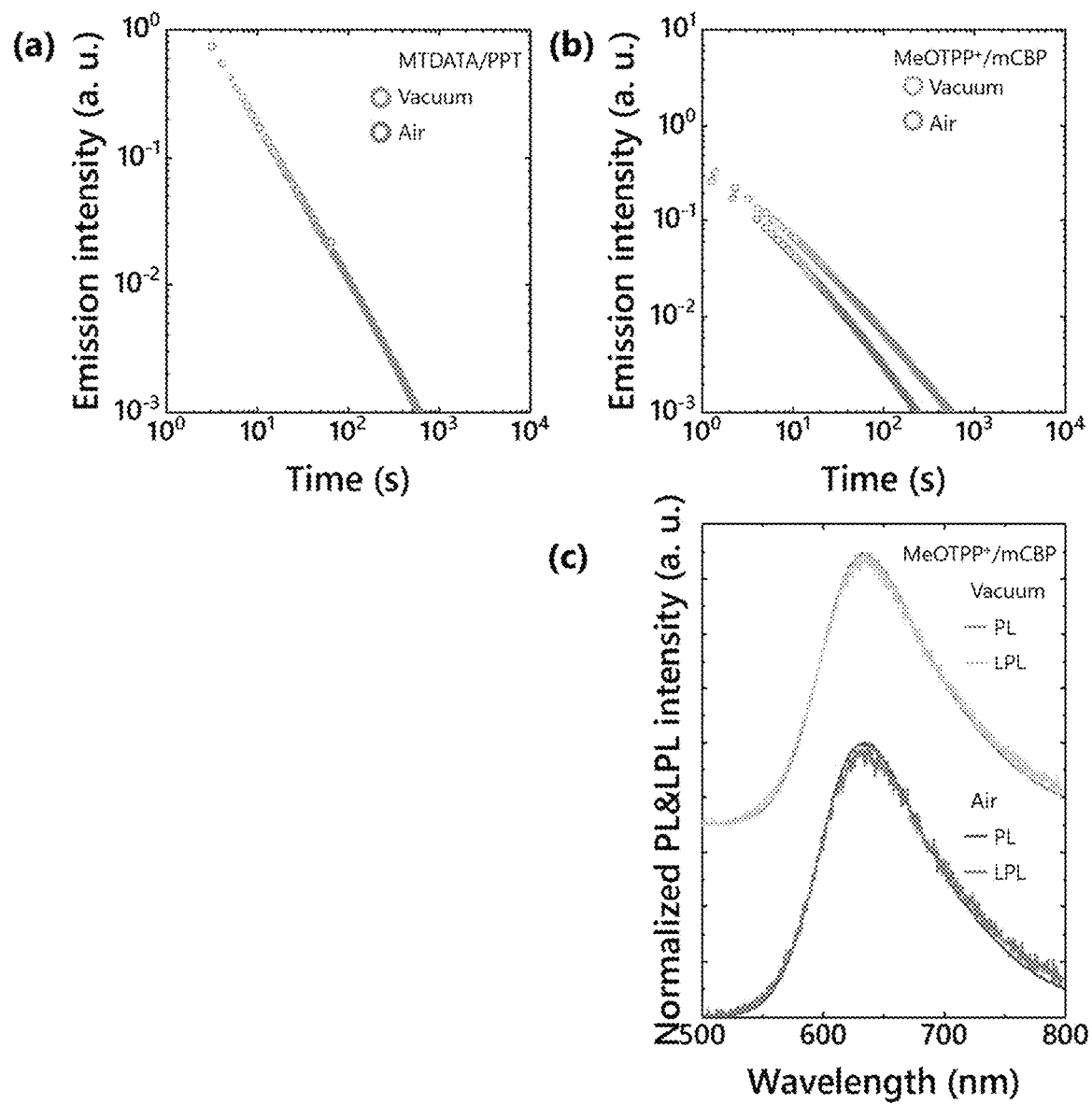
FIG. 11. The LPL duration of the m-MTDATA/PPT (a) and the MeOTPP$^+$/mCBP (b) films in the vacuum and in the air. The PL and LPL spectra in the vacuum and in the air of the MeOTPP$^+$/mCBP film (c).

The optical analysis of the TPP$^+$/TPBi, MeOTPP$^+$/mCBP, and TPP$^+$/TPBi/TCTA films were also carried out in the air to confirm air-stability of the p-type OLPL systems because the LUMO levels of TPP$^+$ (−4.0 eV) and MeOTPP$^+$ (−3.8 eV) are enough lower than the reduction potential of oxygen (−3.5 eV). Although the reported n-type OLPL system of m-MTDATA/PPT does not show LPL emission in the air (FIG. 11a), all the p-type OLPL films exhibited LPL in the air (FIG. 4a, b, FIG. 11b). However, the observed LPL durations of all films in the air are much shorter than those in nitrogen. This is because the reaction with oxygen can be prevented by the lower LUMO levels[18], but the energy transfer from the triplet excited state of the emitters to the molecular oxygen having triplet ground state (triplet quenching) cannot be prevented[41]. The charge recombination process in LPL emission generates both $^1$CT and $^3$CT excited states[42], and the $^3$CT excited states are quenched by oxygen. In contrast, the emission spectra did not change because of no contribution of the $^3$LE (FIG. 4c, d). The LPL duration of the TPP$^+$/TPBi/TCTA in the air was also extended to 1421 seconds which is almost the same as the TPP$^+$/TPBi film in nitrogen although the $\phi_{PL}$ of both films is almost identical. These results indicate that the p-type OLPL system having low HOMO levels can emit LPL in the air but cannot prevent triple quenching by oxygen. To obtain the efficient LPL emission in the air, the future development of the CT excited state having fast reverse intersystem crossing faster than the energy transfer to oxygen or advanced encapsulation techniques to prevent oxygen is required.

OLPL systems based on the cationic organic photoredox catalyst TPP$^+$ and MeOTPP$^+$ as the acceptors are demonstrated here. These systems can be excited by the wavelength from UV to over 600 nm and exhibited yellow to NIR LPL emission. The OLPL having lower HOMO and LUMO levels can prevent reaction with oxygen and exhibited LPL in the air. The hole trapping dopant strongly enhanced the LPL duration without changing the emission spectrum. The tunable absorption wavelength over 600 nm of OLPL systems is a major advantage over inorganic materials, and the absorption and emission fitted to the biological window are expected to have future bio-imaging applications. The OLPLs can prevent the reaction with oxygen in the excited state, making it possible to produce LPL films by a simple solution process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the gist and scope as set forth in the following claims. The "long persistent luminescence emitter" of the present invention is simply referred to as a "persistent luminescence emitter" in the claims because the relative term "long" will be unacceptable to some patent offices due to its ambiguity. The "persistent luminescence emitter" in the claims is to be interpreted to include the concept of "long persistent luminescence emitter" in this description.

TABLE S1

| | | | Optical properties | | | | | | | |
|---|---|---|---|---|---|---|---|---|---|---|
| Material | HOMO (eV) | LUMO (eV)[a] | $\Delta E_{LUMO-HOMO}$ (eV)[c] | $^1$LE (eV)[d] | $^3$LE (eV)[e] | $\Delta E$ ($^1$LE − $^3$LE) (eV) | $\Phi_{PL}$ (%) | Flu. Peak (nm) | Phos. Peak (nm) | $T_{phos.}$ (s) |
| TPP$^+$ | −6.76 | −4.02 | 2.74 | 2.88 | 2.45 | 0.41 | 59.0 | 466 | 559 | 1.2 |
| MeOTPP$^+$ | −6.21 | −3.81 | 2.4 | 2.52 | 2.31 | 0.21 | 82.6 | 530 | 591 | 0.8 |
| TPBi | −5.93 | −2.3 | 3.83 | 3.71 | 2.78 | 0.93 | | 366 | 468 | |
| mCBP | −5.58 | −2.03 | 3.55 | 3.68 | 3.1 | 0.58 | | 348 | 412 | |
| TCTA | −5.27[b] | −1.88 | 3.39 | 3.46 | 2.93 | 0.53 | | 385 | 436 | |

TABLE S1-continued

| | Optical properties | | | | | | | | | |
|---|---|---|---|---|---|---|---|---|---|---|
| Mixture | $HOMO_D$ (eV) | $LUMO_A$ (eV) | $\Delta E$ (eV) | $^1CT$ (eV)[f] | $^3LE_A$ (eV) | $\Delta E$ ($^1CT - {}^3LE_A$) (eV) | $\Phi_{PL}$ (%) | PL peak (nm) | LPL peak (nm) | Duration |
| TPP+/TPBi | −5.93 | −4.02 | 1.91 | 2.41 | 2.45 | −0.04 | 10.0 | 597 | 603 | 1435 |
| TPP+/mCBP | −5.58 | −4.02 | 1.56 | 2.05 | 2.47 | −0.42 | 2.5 | 722 | 731 | 19 |
| MeOTPP+/TPBi | −5.93 | −3.81 | 2.12 | — | 2.31 | — | 1.7 | | | |
| MeOTPP+/mCBP | −5.58 | −3.81 | 1.77 | 2.25 | 2.31 | −0.06 | 6.4 | 636 | 624 | 605 |
| TPP+/TPBi/TCTA | −5.93 | −4.02 | 1.91 | 2.41 | 2.45 | −0.04 | 8.0 | 601 | 601 | 9045 |

[a] Calculated from reduction peaks of the CV.
[b] Calculated from Oxidation peak of the CV.
[c] Calculated from the offset of the absorption spectra.
[d] Calculated from the onset of the fluorescence spectra.
[e] Calculated from the phosphorescence spectra obtained at 77 K.
[f] Calculated from the onset of the CT emission spectra.
[g] Time until the emission intensity drops below 1 pW.

The invention claimed is:

1. A persistent luminescence emitter emitting light for 0.1 seconds or longer after photo-irradiation of the persistent luminescence emitter stops, wherein:

the persistent luminescence emitter comprises an electron donor molecule and an electron acceptor molecule having a LUMO level of lower than −3.5 eV, and emission intensity increases by temperature rise after photo-irradiation of the persistent luminescence emitter stops.

2. The persistent luminescence emitter according to claim 1, wherein an electron transfer occurs from the electron donor molecule to the electron acceptor molecule by photo-irradiation of the persistent luminescence emitter.

3. The persistent luminescence emitter according to claim 1, wherein after photo-irradiation of the persistent luminescence emitter stops, a log-log graph of emission intensity on a logarithmic scale of y-axis and elapsed time on a logarithmic scale of x-axis is linear.

4. The persistent luminescence emitter according to claim 1, wherein after photo-irradiation of the persistent luminescence emitter stops, the emission intensity decay follows a power law.

5. The persistent luminescence emitter according to claim 1, wherein the electron acceptor molecule has a LUMO level of −3.8 eV or lower.

6. The persistent luminescence emitter according to claim 1, wherein the electron acceptor molecule has a HOMO level of −6.0 eV or lower.

7. The persistent luminescence emitter according to claim 1, wherein the electron acceptor molecule is cationic.

8. The persistent luminescence emitter according to claim 7, wherein the electron acceptor molecule is an organic photoredox catalyst.

9. The persistent luminescence emitter according to claim 8, wherein the electron acceptor molecule is represented by one of the following formulae (1) to (4):

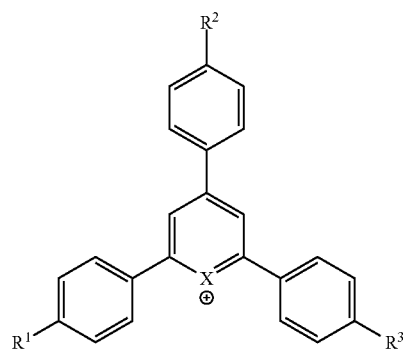

Formula (1)

wherein X represents O or S; and $R^1$ to $R^3$ each independently represent a hydrogen atom or a substituent;

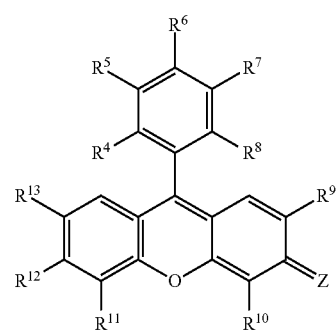

Formula (2)

wherein Z represents O or $NR^{31}R^{32}$; $R^8$ represents $COOR^{33}$; $R^4$ to $R^7$, $R^9$ to $R^{13}$ and $R^{31}$ to $R^{33}$ each independently represent a hydrogen atom or a substituent;

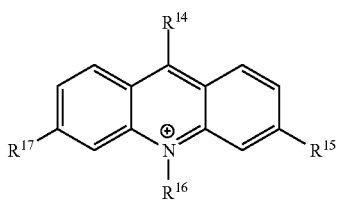

Formula (3)

wherein R¹⁴ to R¹⁷ each independently represent a hydrogen atom or a substituent;

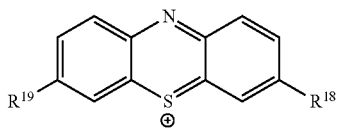

Formula (4)

wherein R¹⁸ and R¹⁹ each independently represent a hydrogen atom or a substituent.

10. The persistent luminescence emitter according to claim 9, wherein the electron acceptor molecule is represented by the formula (1).

11. The persistent luminescence emitter according to claim 1, which comprises the electron acceptor molecule in an amount of at most 10 mol % or at least 90 mol % based on the total amount by mole of the electron donor molecule and the electron acceptor molecule.

12. The persistent luminescence emitter according to claim 1, wherein a charge-transfer excited state formed between the electron donor molecule and the electron acceptor molecule exhibits the persistent luminescence.

13. The persistent luminescence emitter according to claim 1, which further comprises a luminescent material.

14. The persistent luminescence emitter according to claim 1, which further comprises a hole trap material.

15. The persistent luminescence emitter according to claim 1, which further comprises an electron trap material.

16. A method for using a molecule having a LUMO level of lower than −3.5 eV as an acceptor molecule in a persistent luminescence emitter emitting light for 0.1 seconds or longer after photo-irradiation of the persistent luminescence emitter stops.

17. The use according to claim 16, wherein the molecule is an organic photoredox catalyst.

* * * * *